(12) United States Patent
Yang et al.

(10) Patent No.: US 11,274,223 B2
(45) Date of Patent: *Mar. 15, 2022

(54) TRANSPARENT CONDUCTIVE COATINGS BASED ON METAL NANOWIRES AND POLYMER BINDERS, SOLUTION PROCESSING THEREOF, AND PATTERNING APPROACHES

(71) Applicant: C3Nano Inc., Hayward, CA (US)

(72) Inventors: Xiqiang Yang, Newark, CA (US); Ying-Syi Li, Fremont, CA (US); Yungyu Huang, Palo Alto, CA (US); Chris Scully, Campbell, CA (US); Clifford M. Morris, Pleasanton, CA (US); Ajay Virkar, Mountain View, CA (US)

(73) Assignee: C3 Nano, Inc., Hayward, CA (US)

(*) Notice: Subject to any disclaimer, the term of this patent is extended or adjusted under 35 U.S.C. 154(b) by 755 days.

This patent is subject to a terminal disclaimer.

(21) Appl. No.: 14/087,669

(22) Filed: Nov. 22, 2013

(65) Prior Publication Data

US 2015/0144380 A1    May 28, 2015

(51) Int. Cl.
*C09D 11/52* (2014.01)
*H05K 1/09* (2006.01)
*C09D 11/08* (2006.01)
*C09D 11/10* (2014.01)
(Continued)

(52) U.S. Cl.
CPC .............. *C09D 11/52* (2013.01); *C09D 11/08* (2013.01); *C09D 11/10* (2013.01); *C09D 11/38* (2013.01);
(Continued)

(58) Field of Classification Search
CPC .................. H05K 1/097; H05K 3/105; H05K 2201/0108; C09D 11/52; C09D 11/08;
(Continued)

(56) References Cited

U.S. PATENT DOCUMENTS 6,741,019 B1    5/2004  Filas et al.
7,218,004 B2    5/2007  Pan et al.
(Continued)

FOREIGN PATENT DOCUMENTS

CN    1399317 A      2/2003
CN    101128550 A    2/2008
(Continued)

OTHER PUBLICATIONS

Fuse, Definition of Fuse in English. Oxford Dictionaries, https://en.oxforddictionaries.com/definition/fuse. retrieved Mar. 13, 2017.*

(Continued)

*Primary Examiner* — Jennifer A Gillett
(74) *Attorney, Agent, or Firm* — Christensen, Fonder, Dardi; Elizabeth A. Gallo; Peter S. Dardi

(57) ABSTRACT

Polymer binders, e.g., crosslinked polymer binders, have been found to be an effective film component in creating high quality transparent electrically conductive coatings or films comprising metal nanostructured networks. The metal nanowire films can be effectively patterned and the patterning can be performed with a high degree of optical similarity between the distinct patterned regions. Metal nanostructured networks are formed through the fusing of the metal nanowires to form conductive networks. Methods for patterning include, for example, using crosslinking radiation to pattern crosslinking of the polymer binder. The application of a fusing solution to the patterned film can result in low resistance areas and electrically resistive areas. After fusing, the network can provide desirable low sheet resistances while maintaining good optical transparency and low haze. A polymer overcoat can further stabilize conductive films and provide desirable optical effects. The patterned films can be useful in devices, such as touch sensors.

16 Claims, 7 Drawing Sheets

(51) Int. Cl.
*H05K 3/10* (2006.01)
*C09D 11/38* (2014.01)
*H05K 3/12* (2006.01)

(52) U.S. Cl.
CPC ............. *H05K 1/097* (2013.01); *H05K 3/105* (2013.01); *H05K 3/1283* (2013.01); *H05K 2201/0108* (2013.01); *H05K 2201/026* (2013.01)

(58) Field of Classification Search
CPC ........... C09D 11/10; C09D 11/38; B32B 5/02; B32B 5/14; B32B 5/24; B32B 15/02; B32B 2255/205; B32B 2307/206; B32B 2307/202; B32B 2307/412
See application file for complete search history.

(56) References Cited

U.S. PATENT DOCUMENTS

| | | |
|---|---|---|
| 7,849,424 B2 | 12/2010 | Wolk et al. |
| 7,902,639 B2 | 3/2011 | Garrou et al. |
| 7,922,787 B2 | 4/2011 | Wang et al. |
| 8,018,563 B2 | 9/2011 | Jones et al. |
| 8,018,568 B2 | 9/2011 | Allemand et al. |
| 8,031,180 B2 | 10/2011 | Miyamoto et al. |
| 8,049,333 B2 | 11/2011 | Alden et al. |
| 8,052,773 B2 | 11/2011 | Takada |
| 8,094,247 B2 | 1/2012 | Allemand et al. |
| 8,174,667 B2 | 5/2012 | Allemand et al. |
| 8,198,796 B2 | 6/2012 | Takada |
| 9,150,746 B1 | 10/2015 | Li et al. |
| 9,183,968 B1 | 11/2015 | Li et al. |
| 9,396,843 B2 | 7/2016 | Chung et al. |
| 10,026,518 B2 | 6/2018 | Sepa et al. |
| 10,020,807 B2 | 7/2018 | Virkar et al. |
| 10,100,213 B2 | 10/2018 | Li et al. |
| 2003/0022518 A1 | 1/2003 | Munakata et al. |
| 2005/0074589 A1 | 4/2005 | Pan et al. |
| 2005/0196707 A1 | 9/2005 | Cok |
| 2005/0214480 A1 | 9/2005 | Garbar et al. |
| 2005/0215689 A1 | 9/2005 | Garbar et al. |
| 2006/0052947 A1 | 3/2006 | Hu |
| 2006/0083694 A1 | 4/2006 | Kodas et al. |
| 2006/0163744 A1 | 7/2006 | Vanheusden et al. |
| 2006/0205240 A1 | 9/2006 | Pan et al. |
| 2007/0074316 A1 | 3/2007 | Alden et al. |
| 2008/0003130 A1 | 1/2008 | Xia et al. |
| 2008/0034921 A1 | 2/2008 | Vanheusden et al. |
| 2008/0050513 A1 | 2/2008 | Wang et al. |
| 2008/0143906 A1 | 6/2008 | Allemand et al. |
| 2008/0147019 A1 | 6/2008 | Song et al. |
| 2008/0210052 A1 | 9/2008 | Allemand |
| 2008/0213663 A1 | 9/2008 | Hu et al. |
| 2008/0259262 A1 | 10/2008 | Jones et al. |
| 2008/0283799 A1 | 11/2008 | Alden et al. |
| 2008/0286447 A1 | 11/2008 | Alden et al. |
| 2008/0286488 A1 | 11/2008 | Li et al. |
| 2008/0292979 A1 | 11/2008 | Ding et al. |
| 2008/0317982 A1 | 12/2008 | Hecht et al. |
| 2009/0011147 A1 | 1/2009 | Dictus |
| 2009/0052029 A1 | 2/2009 | Dai et al. |
| 2009/0088326 A1 | 4/2009 | Baecker |
| 2009/0098405 A1 | 4/2009 | Matsunami |
| 2009/0129004 A1 | 5/2009 | Gruner |
| 2009/0130433 A1 | 5/2009 | Takada |
| 2009/0166055 A1 | 7/2009 | Guiheen et al. |
| 2009/0196788 A1 | 8/2009 | Wang et al. |
| 2009/0223703 A1 | 9/2009 | Winoto |
| 2009/0242231 A1 | 10/2009 | Miyagisima et al. |
| 2009/0283304 A1 | 11/2009 | Winoto |
| 2009/0301769 A1 | 12/2009 | Seppa et al. |
| 2009/0305437 A1 | 12/2009 | Allemand et al. |
| 2009/0311530 A1 | 12/2009 | Hirai et al. |
| 2009/0317435 A1 | 12/2009 | Vandesteeg et al. |
| 2009/0321113 A1 | 12/2009 | Allemand et al. |
| 2009/0321364 A1 | 12/2009 | Spaid et al. |
| 2010/0078197 A1 | 4/2010 | Miyagishima et al. |
| 2010/0078602 A1 | 4/2010 | Hosoya et al. |
| 2010/0140564 A1 | 6/2010 | Overbeek et al. |
| 2010/0197068 A1 | 8/2010 | Poon et al. |
| 2010/0243295 A1 | 9/2010 | Allemand et al. |
| 2010/0269635 A1 | 10/2010 | Vanheusden et al. |
| 2010/0307792 A1 | 12/2010 | Allemand et al. |
| 2011/0024159 A1 | 2/2011 | Allemand et al. |
| 2011/0042126 A1 | 2/2011 | Spaid et al. |
| 2011/0045272 A1 | 2/2011 | Allemand |
| 2011/0048170 A1 | 3/2011 | Bhatia et al. |
| 2011/0062389 A1 | 3/2011 | Wang et al. |
| 2011/0088770 A1 | 4/2011 | Allemand et al. |
| 2011/0094651 A1 | 4/2011 | Kuriki |
| 2011/0095275 A1 | 4/2011 | Li et al. |
| 2011/0151211 A1 | 6/2011 | Chang et al. |
| 2011/0162870 A1 | 7/2011 | Markovich et al. |
| 2011/0163403 A1 | 7/2011 | Bhatia et al. |
| 2011/0174190 A1 | 7/2011 | Sepa et al. |
| 2011/0192633 A1 | 8/2011 | Allemand |
| 2011/0253668 A1 | 10/2011 | Winoto et al. |
| 2011/0281070 A1 | 11/2011 | Mittal et al. |
| 2011/0285019 A1 | 11/2011 | Alden et al. |
| 2011/0297642 A1 | 12/2011 | Allemand et al. |
| 2012/0033367 A1 | 2/2012 | Jones et al. |
| 2012/0034129 A1 | 2/2012 | Suh et al. |
| 2012/0073947 A1 | 3/2012 | Sakata et al. |
| 2012/0097059 A1 | 4/2012 | Allemand et al. |
| 2012/0103660 A1 | 5/2012 | Gupta et al. |
| 2012/0104374 A1 | 5/2012 | Allemand |
| 2012/0107598 A1 | 5/2012 | Zou et al. |
| 2012/0127097 A1 | 5/2012 | Gaynor et al. |
| 2012/0127113 A1 | 5/2012 | Yau et al. |
| 2012/0132930 A1 | 5/2012 | Young et al. |
| 2012/0138913 A1* | 6/2012 | Alsayed ................ B22F 1/0025 257/40 |
| 2012/0168684 A1* | 7/2012 | Magdassi ............... B82Y 30/00 252/500 |
| 2012/0183768 A1 | 7/2012 | Kondo et al. |
| 2012/0217453 A1 | 8/2012 | Lowenthal et al. |
| 2012/0223358 A1 | 9/2012 | Pschenitzka |
| 2012/0249453 A1 | 10/2012 | Tsukamoto |
| 2013/0000952 A1 | 1/2013 | Srinivas et al. |
| 2013/0001478 A1 | 1/2013 | Allemand et al. |
| 2013/0056244 A1 | 3/2013 | Srinivas et al. |
| 2013/0146335 A1 | 6/2013 | Gambino et al. |
| 2013/0153829 A1 | 6/2013 | Kondo et al. |
| 2013/0189502 A1 | 7/2013 | Takahashi et al. |
| 2013/0266795 A1 | 10/2013 | Schultz et al. |
| 2013/0291683 A1 | 11/2013 | Sepa et al. |
| 2013/0341074 A1 | 12/2013 | Virkar et al. |
| 2013/0342221 A1 | 12/2013 | Virkar et al. |
| 2014/0004371 A1 | 1/2014 | Chung et al. |
| 2014/0054515 A1 | 2/2014 | Lowenthal et al. |
| 2014/0099486 A1 | 4/2014 | Ollmann et al. |
| 2014/0238833 A1 | 8/2014 | Virkar et al. |
| 2014/0255707 A1 | 9/2014 | Philip, Jr. et al. |
| 2014/0262454 A1 | 9/2014 | Zou et al. |
| 2014/0374146 A1 | 12/2014 | Saito et al. |
| 2015/0017457 A1 | 1/2015 | Mizuno et al. |
| 2015/0036276 A1 | 2/2015 | Kaneko et al. |
| 2015/0152135 A1 | 6/2015 | Stebbins et al. |
| 2015/0206623 A1 | 7/2015 | Poon |
| 2015/0208498 A1 | 7/2015 | Poon |
| 2015/0321257 A1* | 11/2015 | Suh ....................... B22F 1/0025 252/514 |
| 2016/0096967 A1 | 4/2016 | Virkar et al. |
| 2016/0108256 A1 | 4/2016 | Yang et al. |
| 2016/0122562 A1 | 5/2016 | Yang et al. |
| 2017/0015857 A1 | 1/2017 | Kodama et al. |

FOREIGN PATENT DOCUMENTS

| | | |
|---|---|---|
| CN | 101292362 A | 10/2008 |
| CN | 101522947 A | 9/2009 |
| CN | 101589473 A | 11/2009 |
| CN | 102131602 A | 7/2011 |

(56) References Cited

FOREIGN PATENT DOCUMENTS

| | | | |
|---|---|---|---|
| CN | 102193697 A | | 9/2011 |
| CN | 102250506 A | | 11/2011 |
| CN | 102544223 A | | 7/2012 |
| CN | 102686777 A | | 9/2012 |
| CN | 102763171 A | | 10/2012 |
| CN | 102819338 A | | 12/2012 |
| CN | 102819341 A | | 12/2012 |
| CN | 102834472 A | | 12/2012 |
| CN | 102883822 A | | 1/2013 |
| CN | 102971805 A | | 3/2013 |
| CN | 103380466 A | | 10/2013 |
| CN | 103827790 A | | 5/2014 |
| CN | 104508758 A | | 4/2015 |
| CN | 104685577 B | | 6/2015 |
| CN | 105102555 A | | 11/2015 |
| CN | 105874889 B | | 7/2019 |
| JP | 2006070300 A | * | 3/2006 |
| JP | 2009-505358 A | | 2/2009 |
| JP | 2009-129882 A | | 6/2009 |
| JP | 2010-507199 A | | 3/2010 |
| JP | 2011-119142 A | | 6/2011 |
| JP | 2011-210454 A | | 10/2011 |
| JP | 2012009383 A | | 1/2012 |
| JP | 2012-022844 A | | 2/2012 |
| JP | 2012-526359 A | | 10/2012 |
| JP | 2012-216535 A | | 11/2012 |
| JP | 2013-084628 A | | 5/2013 |
| JP | 2013-517063 A | | 5/2013 |
| JP | 2013-518974 A | | 5/2013 |
| JP | 5289859 B2 | | 9/2013 |
| JP | 2016-519206 A | | 6/2016 |
| KR | 10-2007-0029151 | | 3/2007 |
| KR | 10-2012-003407 A | | 3/2012 |
| KR | 10-2012-0086635 A | | 8/2012 |
| KR | 20130027634 A | * | 3/2013 |
| KR | 2013-0102723 A | | 9/2013 |
| TW | 2009-39251 A | | 9/2009 |
| TW | 2011-10144 A | | 3/2011 |
| TW | 2011-37062 A | | 11/2011 |
| TW | 2009-23971 A | | 9/2012 |
| TW | 2012-36967 A1 | | 9/2012 |
| WO | 2005-005687 A1 | | 1/2005 |
| WO | 2006-072959 A1 | | 7/2006 |
| WO | 2008/046058 A2 | | 4/2008 |
| WO | 2009-035059 A1 | | 3/2009 |
| WO | 2009/086161 | | 7/2009 |
| WO | 2009/156990 | | 12/2009 |
| WO | 2010/036113 | | 4/2010 |
| WO | 2010-109465 A1 | | 9/2010 |
| WO | 2010-129604 A1 | | 11/2010 |
| WO | 2011008227 A1 | | 1/2011 |
| WO | 2011-088323 A2 | | 7/2011 |
| WO | 2011-097470 A2 | | 8/2011 |
| WO | 2011-106730 A2 | | 9/2011 |
| WO | 2012-102556 A2 | | 8/2012 |
| WO | 2012-168941 A1 | | 12/2012 |
| WO | 2013/006349 A1 | | 1/2013 |
| WO | 2013/040245 A2 | | 3/2013 |
| WO | 2013-047556 A1 | | 4/2013 |
| WO | 2013-056242 A1 | | 4/2013 |
| WO | 2013-094926 A1 | | 6/2013 |
| WO | 2013-095971 A1 | | 6/2013 |
| WO | 2013-128458 A1 | | 9/2013 |
| WO | 2013-133272 A1 | | 9/2013 |
| WO | 2013-133285 A1 | | 9/2013 |
| WO | 2014-127909 A1 | | 8/2014 |
| WO | 2014-133890 A2 | | 9/2014 |
| WO | 2015-077145 A2 | | 5/2015 |

OTHER PUBLICATIONS

Garnett et al., "Self-limited Plasmonic Welding of Silver Nanowire Junctions," Nature Materials, vol. 11, p. 241-249, Mar. 2012.
Spechler et al., "Direct Write Pulsed Laser Processed Silver Nanowire Networks for Transparent Conducting Electrodes," Springer-Verlag, vol. 108, pp. 25-28, May 10, 2012.
Taiwan office action from corresponding Taiwan Application No. 103140507, with translation, dated Jul. 30, 2015 (22 pages).
Chang et al., "Highly foldable transparent conductive films composed of silver nanowire junctions prepared by chemical metal reduction," Nanotechnology, 25 (2014) 285601 (7 pages).
International Search Report and Written Opinion from international application No. PCT/US14/65685 dated Apr. 7, 2015 (10 pages).
Bi et al., "In situ Oxidation synthesis of AG/AGCI core-shell nanowires and their photocatalytic properties," Chem. Commun. (2009), pp. 6551-6553.
De et al., "Silver Nanowire Networks as Flexible, Transparent Conducting Films: Extremely High DC to Optical Conductivity Ratio," ACS Nano, 3(7):1767-1774 (Jun. 2009).
Grouchko et al., "Conductive Inks with 'built-in' mechanism that enables sintering at room temperature," ACS Nano, 5(4):3354-3359 (2011).
Hu et al., "Scalable coating properties of flexible, silver nanowire electrodes," ACS Nano, 4(5):2955-2963 (2010).
Lam et al., "Self-diffusion in silver at low temperatures," Phys. Stat. Sol. (b), 57 (1973), p. 225-236.
Liu et al., "Silver Nanowire-Based Transparent, Flexible and Conductive Thin Film," Nanoscale Research Letters, vol. 6(75), Jan. 2011, 8 pages.
Luo et al., "Size effect on thermodynamic properties of silver nanoparticles," J. Phys. Chem. C, 112 (2008), pp. 2359-2369.
Magdassi et al., "Triggering the Sintering of Silver Nanoparticles at Room Temperature," ACS Nano, 4(4):1943-1948 (2010).
Nanda, et al., "Higher surface free energy of free nanoparticles," Phys. Rev. Letters, 91(10):106102-1 (2003).
Pothoven, "Laser Patterning of Silver Nanowires," Information Display Magazine, Sep. 2012, 28(9), (10 pages).
Raaen, "Diffusion in silver fluoride," Physical Review B, 21(10):4895-4897 (1980).
Redmond et al., "Electrochemical Ostwald ripening of colloidal Ag particles on conductive substrates," Nano Letters, 5(1):131-135 (2005).
Safaei et al., "Modeling the Melting Temperature of Nanoparticles by an Analytical Approach," J. Phys. Chem. C, 112 (2008), pp. 99-105.
Sun et al., "AgCI nanoparticle nanowires fabricated by template method," Materials Letters, 61 (2007), pp. 1645-1648.
Van Heyningen, "Electron Drift Mobility in Silver Chloride," Physical Review, (Dec. 1, 1962), pp. 2112-2118.
Yan et al., "Recent Research Progress on Preparation of Silver Nanowires by Soft Solution Method," Rev. Adv. Mater. Sci. 24, (2010), pp. 10-15.
Tokuno et al., "Fabrication of Silver Nanowire Transparent Electrodes at Room Tempature," Nano Research, (2011), 4(12): 1215-1222.
Zhu et al., "Transferable Sefl-welding Silver Nanowire Network as High Performance Transparent Flexible Electrode," Nanotechnology 24, (Jul. 26, 2013), 24(335202): 1-7.
European Search Report from corresponding European Patent Application 14863676.4 dated May 22, 2017 (8 pages).
Gu, Shouwu, "The Creation of Nanojunctions", The Royal Society of Chemistry, Nanoscale, (2010), 2, pp. 2521-2529.
Japanese office action from corresponding Japanese Application No. 2016-533161 dated Oct. 30, 2018.
Japanese Office Action from corresponding Japanese Application No. 2016-533161 dated Jun. 11, 2019.
Allen, "Photoinitiators for UV and visible curing of coatings: mechanisms and properties", Journal of Photochemistry and Photobiology A Chemistry, vol. 100, (1996) p. 101-107.
Cambrios Archived Website, ClearOhm, "High Performance Transparent Conductive Material", Cambrios Technologies Corporation, Nov. 2010.
Chen et al., "Polysaccharide Hydrogenls for Protein Drug Delivery", Carbohydrate Polymers, 28, (1995), p. 69-76.
Coskun et al., "Optimization of silver nanowire networks for polymer light emitting diode electrodes", Nanotechnology, 24, 125202, (2013) p. 1-9.

(56) References Cited

OTHER PUBLICATIONS

Ducamp-Sanguesa et al. "Synthesis and Characterization of Fine and Monodisperse Silver Particles of Uniform Shape", Journal of Solid State Chemistry, vol. 100 pp. 272-280 (1992).

Hu et al., "Metal nanogrids, nanowires, and nanofibers for transparent electrodes", MRS Bulletin, vol. 36, p. 1-7, Oct. 2011.

Imam et al., "Biobased adhesives, gums, emulsions, and binders: current trends and future prospects", Journal of Adhesion Science and Technology, vol. 27, Nos. 18-19, 1972-1997, (2013).

Kang et al., "Halide Welding for Silver Nanowire Network Electrode," ACS Applied Materials & Interfaces 2017, 9, 30779-30785, Apr. 18, 2017.

Kang et al., "Epitaxial-Growth-Induced Junction Welding of Silver Nanowire Network Electrodes" CS Nano 2018, 12, 4894-4902, Apr. 2018.

Khanarian et al., "The Optical and Electrical Properties of Silver Nanowire Mesh Films", Journal of Applied Physics, 114(024302), doi: 10.1063/1.4812390, (2013).

Kim et al., "Large Discrete Resistance Jump at Grain Boundary in Copper Nanowire", American Chemical Society Nano Letters 2010, 10, 3096-3100, Jul. 7, 2010.

Kumar et al., "Silver nanowire based flexible electrodes with improved properties: High conductivity, transparency, adhesion and low haze", Material Research Bulletin, vol. 48, (2013), p. 2944-2949.

Kunjappu, "Ink Chemistry", www.chemistryworld.com/news/ink-chemistry/3002158.article, p. 1-18, Feb. 20, 2019.

Ma et al., "Synthesis of small silver nanocubes in a hydrophobic solvent by introducing oxidative etching with Fe(III) species†". Journal of Materials Chemistry 2010, 20, 3586-3589, Apr. 9, 2010.

Madaria et al., "Uniform, Highly Conductive, and Patterned Transparent Films of a Percolating Silver Nanowire Network on Rigid and Flexible Substrates Using a Dry Transfer Technique", NanoRes, (2010) 3: 564-573.

Martin et al., "Hydrophilic Matrix Tablets for Oral Controlled Release", AAPS Advances in the Pharmaceutical Sciences Series 16, DOI 10.1007/978-1-4939-1519-4_5. (2014).

Poole, C.F., "Pyrolysis Gas Chromatography", Gas Chromatography, Chapter 11, Elservier Inc., (2012).

Lu et al., "Cold welding of ultrathin gold nanowires", Nature Nanotechnology, vol. 5, Mar. 2005, p. 218-224.

Sun et al., "Crystalline Silver Nanowires by Soft Solution Processing", ACS Nano Letters 2002, vol. 2 No. 2, 165-168, Jan. 3, 2002.

Wang et al., "Water-Soluble Ethylhydroxyethyl Cellulose Prevents Bacterial Translocation Induced by Major Liver Resection in the Rat", Annals of Surgery, vol. 217 No. 2, p. 155-167, (1993).

Wiley et al., "Polyol Synthesis of Silver Nanostructures: Control of Product Morphology with Fe(II) or Fe(III) Species", ACS Journal of Surfaces and Colloids, vol. 21 No. 18, 8077-8080, Aug. 30, 2005.

Bermocoll® E 230 FQ Product Information, Akzo Nobel Chemicals AG, Performance Additives, www.akzonobel.com/pa.

* cited by examiner

TRANSPARENT CONDUCTIVE COATINGS BASED ON METAL NANOWIRES AND POLYMER BINDERS, SOLUTION PROCESSING THEREOF, AND PATTERNING APPROACHES

FIELD OF THE INVENTION

The invention relates to transparent, electrically conductive films formed with fused metal nanostructured networks. The invention further relates to precursor inks, processing approaches and patterning techniques.

BACKGROUND OF THE INVENTION

Functional films can provide important functions in a range of contexts. For example, electrically conductive films can be important for the dissipation of static electricity when static can be undesirable or dangerous. Optical films can be used to provide various functions, such as polarization, anti-reflection, phase shifting, brightness enhancement or other functions. High quality displays can comprise one or more optical coatings.

Transparent conductors can be used for several optoelectronic applications including, for example, touch-screens, liquid crystal displays (LCD), flat panel display, organic light emitting diode (OLED), solar cells and smart windows. Historically, indium tin oxide (ITO) has been the material of choice due to its relatively high transparency at high conductivities. There are however, several shortcomings with ITO. For example, ITO is a brittle ceramic which needs to be deposited using sputtering, a fabrication process that involves high temperatures and vacuum and therefore is relatively slow and not cost effective. Additionally, ITO is known to crack easily on flexible substrates.

SUMMARY OF THE INVENTION

In a first aspect, the invention pertains to a coated substrate comprising a conductive coating over at least a portion of the substrate. The conductive coating can comprise a nanostructured metal network and a crosslinked polymer binder and can have a sheet resistance of no more than about 270 ohms/square, an optical transmittance of at least about 90% and a haze of no more than about 1%. In some embodiments the substrate further comprises another portion of the substrate surface comprising an insulating coating. The insulating coating comprises a polymer binder and metal nanowires and has a sheet resistance of at least about 20,000 ohms/square, an optical transmittance of at least about 90% and a haze of no more than about 1%.

In a further aspect, the invention pertains to a metal nanowire ink comprising a solvent, from about 0.01 weight percent (wt %) to about 2 wt % metal nanowires, from about 0.02 wt % to about 5 wt % crosslinkable organic polymer and from about 0.05 wt % to about 2 wt % of a wetting agent, polymer dispersant, thickener, or a mixture thereof.

In additional aspects, the invention pertains to a conductive film processing system comprising a metal nanowire ink and a fusing solution. In some embodiments, the metal nanowire ink comprises a solvent, from about 0.01 wt % to about 2 wt % metal nanowires, from about 0.02 wt % to about 5 wt % crosslinkable organic polymer and from about 0.05 wt % to about 2 wt % processing additive, and the fusing solution comprises a solvent and a fusing agent.

In another aspect, the invention pertains to a method for forming a patterned electrically conductive transparent coating, the method comprising applying a metal nanowire fusing solution to a patterned initial coating layer on a substrate to form a patterned differentially conductive coating having regions with a sheet resistance of no more than about 270 ohms/sq and regions having a sheet resistance of at least about 20,000 ohms/sq. The fusing solution can comprise a fusing agent, and the patterned initial coating layer can comprise regions of metal nanowires and uncrosslinked radiation curable polymer and other regions of metal nanowires and crosslinked polymer.

In other aspects, the invention pertains to a method for the formation of a fused metal nanostructured network, the method comprising depositing a fusing solution having an alkaline composition with a concentration of hydroxide anions of at least about $3 \times 10^{-5}$ M or a pH of at least about 9.5 pH units onto a layer of metal nanowires to fuse the metal nanowires. The fusing solution can further comprise a metal salt.

Furthermore, the invention pertains to a patterned structure comprising a substrate with a surface, a pattern of electrically conductive regions and electrically insulating regions patterned on the surface and metal traces forming electrical conduction pathways between electrically conductive regions and a connection zone spaced away from the patterned regions, and a polymer overcoat covering at least a portion of the metal traces. In some embodiments of the invention the electrically conductive regions and the electrically insulating regions each have a metal loading on the substrate surface from about 0.5 mg/m$^2$ to about 200 mg/m$^2$ and the sheet resistance of the electrically insulating regions is at least about a factor of 100 greater than the sheet resistance of the electrically conducting regions.

DETAILED DESCRIPTION OF THE INVENTION

Figure 1:
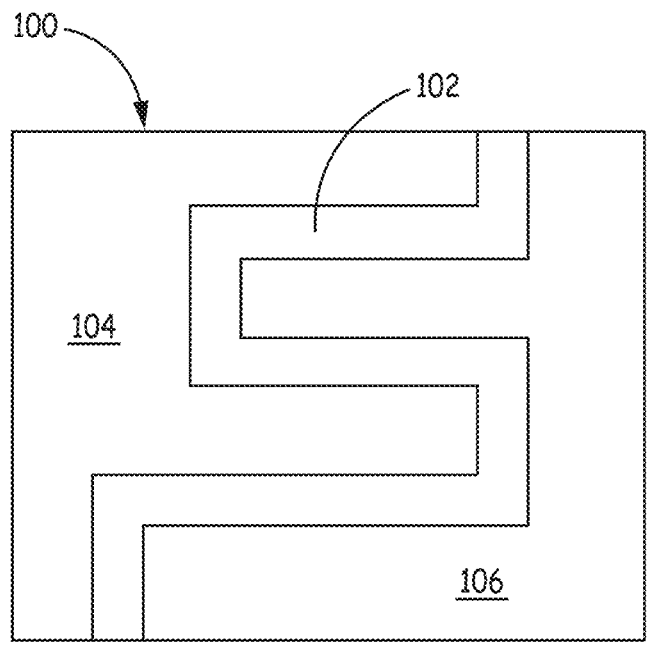
FIG. 1 is a schematic diagram showing fused metal network along the substrate surface forming a conductive pattern with a single pathway.

High quality transparent electrically conductive coatings or films can comprise fused metal nanostructured networks with a polymer binder, e.g., a crosslinked polymeric binder. The coatings can be effectively formed using a solution to deposit metal nanowires dispersed with a polymer binder with the subsequent addition of a fusing solution or vapor that mobilizes metal ions to form a fused metal nanowire network. In some embodiments, the coatings can simultaneously achieve a low sheet resistance, good optical transparency to visible light and low haze. Thus, the films are well suited to a range of commercial applications where a transparent electrical conductor is desired. The coating process can be adapted for a range of convenient patterning approaches to form regions with high electrical conductivity and other regions of high electrical resistance. The patterning can be performed with a high degree of optical similarity between the distinct patterned regions. While several patterning options are available, convenient patterning has been discovered using crosslinking radiation which can be patterned with respect to irradiation of the surface with a precursor film using a mask, scanning the radiation or the like. It has been discovered that application of a fusing solution following irradiation to form patterned regions along the film can result in uncrosslinked/unirradiated regions of the surface being subjected to nanowire fusing to form a metal nanostructured network with low sheet resistance while the crosslinked/irradiated portions of the substrate remaining electrically resistive. A polymer overcoat can further stabilize conductive films and provide desirable optical effects.

The processing to form an electrically conductive optically transparent film can comprise the sequential deposition of a metal nanowire ink and subsequently a fusing solution or vapor. The metal nanowire ink can be deposited to form a film with high electrical resistance through the deposition of the metal nanowire ink. Deposition of the fusing solution or contact with a fusing vapor can convert an electrically insulating metal nanowire film into a conducting film with fused metal nanostructured network that can effectively form a transparent conductive electrode or other transparent conductive structure. Inclusion of an appropriate polymer binder in the metal nanowire ink can result in optical properties as good as or better than obtained with similar inks that lack the binder without interfering with the metal nanowire fusing process that controls introduction of electrical conductivity. Also, the binders in the improved inks described herein provide desirable processability, and mechanical stabilization. Furthermore, film processing with a fusing solution or vapor can provide for patterning with desirably high contrast in electrical conductivity as well as good optical properties across the film based on several alternative processing approaches.

In general, patterning of the transparent conductive layers can be effectively accomplished in several ways for the electrically conductive films based on fused metal nanostructured networks. For example, patterning to form regions with good electrical conductivity and regions with low electrical conductivity can be accomplished through patterning of the metal layer coverage, patterning of the deposition of the fusing agent and/or patterning of the binder crosslinking prior to delivery of the fusing agent. The timing for the performing the fusing of a metal nanowire film can be selected consistent with the patterning approach. The fusing can be based on contact with a halide based fusing agent and/or a chemical reduction based fusing agent, and/or a fusing solution based on basic solutions and/or fusing solutions containing metal ions.

Metal nanowires can be formed from a range of metals, and metal nanowires are available commercially. While metal nanowires are inherently electrically conducting, the vast majority of resistance in the metal nanowires based films is believed to due to the junctions between nanowires. Depending on processing conditions and nanowire properties, the sheet resistance of a relatively transparent nanowire film, as deposited, can be very large, such as in the giga-ohm/sq range or even higher. Various approaches have been proposed to reduce the electrical resistance of the nanowire films without destroying the optical transparency. Low temperature chemical fusing to form a metal nanostructured network has been found to be very effective at lowering the electrical resistance while maintaining the optical transparency.

In particular, a significant advance with respect to achieving electrically conductive films based on metal nanowires has been the discovery of well controllable processes to form a fused metal network where adjacent sections of the metal nanowires fuse. In particular, it was discovered in previous work that halide ions can drive the fusing of metal nanowires to form fused metal nanostructures. Fusing agents comprising halide anions were introduced in various ways to successfully achieve the fusing with a corresponding dramatic drop in the electric resistance. Specifically, the fusing of metal nanowires with halide anions has been accomplished with vapors and/or solutions of acid halides as well as with solutions of halide salts. Fusing of metal nanowires with halide sources is described further in copending U.S. patent application Ser. No. 13/530,822 to Virkar et al., entitled "Metal Nanowire Networks and Transparent Conductive Material," and Ser. No. 13/664,159 to Virkar et al. (the '159 application), entitled "Metal Nanostructured Networks and Transparent Conductive Material," both of which are incorporated herein by reference. The '159 application describes effective patterning based on the selective delivery of HCl vapors for forming high electrical conductivity contrast patterns that are effectively invisible to an ordinary observer under room lighting.

Metal halides formed along the surface of metal nanowires are believed to increase the mobility/diffusivity of the metal ions that result in fusing of points of contact or near contact between nanowires to form the fused network. Evidence suggests that a metal halide shell forms on the resulting fused nanowire network when the halide fusing agents are used. While not wanting to be limited by theory, it is believed that the metal halide coating on the metal nanowires results in mobilization of metal atoms/ions from the nanowires such that the mobilized ions condense to form joints between nearby nanowires forming the nanostructured network and presumably lowering the free energy when forming the fused network with a net movement of metal atoms within the nanostructure.

An extension of the process for forming fused metal nanowire networks was based on reduction/oxidation (redox) reactions that can be provided to result in fused nanowires without destroying the optical properties of the resulting film. Without wanting to be limited by theory, again the driving force would seem to be a lowering of free energy through the migration of metal to junctions to form a fused nanostructured network. Metal for deposition at the junctions can be effectively added as a dissolved metal salt or can be dissolved from the metal nanowires themselves. The effective use of redox chemistry for fusing metal nanowires into a nanostructured network is described further in Ser. No. 13/777,802 to Virkar et al. (the '802 application), entitled "Fused Metal Nanostructured Networks, Fusing Solutions With Reducing Agents and Methods for Forming Metal Networks," incorporated herein by reference. The present ink advances build on the earlier work involving halide and redox based chemical fusing. The '802 application also described a single solution approach for the formation of fused metal nanostructured networks, but the focus herein is on processing with a distinct fusing solution and/or fusing vapor.

A further new approach for the fusing of the nanowires is described herein based on providing a high pH, i.e., alkaline, fusing solution to a metal nanowire film. Generally, to achieve effective fusing, the pH can be greater than about 9.5 pH units. It is believed that the alkaline conditions effectively mobilize metal ions along the surface of the metal nanowires. The metal then selectively mobilizes to points of contact or near contact between adjacent metal nanowires to fuse the wires. Thus, the alkaline fusing provides another alternative to the halide based fusing or the reduction based fusing.

In some embodiments, films formed from metal nanowires can be desired to have good electrical conductivity, high optical transparency, and low haze. Electrical conductivity can be evaluated using sheet resistance with a low sheet resistance corresponding with good electrical conductivity. Haze relates to the scattering of light that can blur an image. While increasing metal nanowire loading can increase electrical conductivity, the higher loading generally deteriorates the optical properties. To increase the electrical conductivity of metal nanowire films, it has been proposed to use mechanical forces to drive the nanowires closer together to decrease junction resistance. See, for example, flattening of nanowire junctions in U.S. Pat. No. 8,049,333 to Alden et al., entitled "Transparent Conductors Comprising Metal Nanowires," incorporated herein by reference. Similarly, the embedding of the metal nanowires in a matrix to reduce junction resistance is described further in published U.S. patent application 2013/0056244 to Srinivas et al., entitled "Patterned Transparent Conductors and Related Manufacturing Methods," incorporated herein by reference. In contrast, the chemical fusing approach is demonstrated to provide excellent optical properties along with low sheet resistances and is consistent with depositing inks with polymer binders and other processing aids. Thus, the inks can be processed conveniently with several practical patterning options to provide a very large electrical conductivity contrast and good optical properties. In some embodiments, the patterned films can have a corresponding low optical property contrast between portions of the pattern.

As noted above, the processing systems for forming electrically conductive films can have, a metal nanowire ink, and a fusing solution or a source of a vapor fusing agent. In some embodiments, the metal nanowire inks generally can comprise a solvent, metal nanowires, a crosslinkable polymer binder, one or more optional ink additives, such as an optional wetting agent or an optional thickener, and other optional additives. As discussed further below, the nanowire concentration influences the ink properties as well as the loading of nanowires formed on the substrate surface. The polymer binder can influence the rheology of the ink, stabilizes the ink, stabilizes the deposited film, and/or provides for additional patterning options. Appropriately selected binders can avoid significantly degrading and may provide at least some improvement in the optical properties of the resulting transparent conductive film without increasing the sheet resistance. With respect to metal nanowire inks formulated with a polymer binder, the nanowire inks provide the surprising ability to maintain the high electrical resistance for unfused metal nanowires embedded in the polymer binder without eliminating the ability to selectively fuse the nanowires into a fused metal nanostructured network. Thus, the polymer binders and other additives may not interfere with the ability to form high contrast between regions along the substrate with respect to electrical conductivity.

The fusing solution can provide an agent to chemically fuse the metal nanowires into a conductive network. The chemical agent can be halide anions and/or a reducing agent combined with a metal ion source. The reducing agent may or may not be a solvent for the system, such as a reducing alcohol. The metal ion source can be, for example, an oxidizing agent, such as an acid, to generate metal ions from the metal nanowires themselves or a dissolved metal salt which can provide metal ions that are the same element or a different element from the metal element in the nanowires. In general, the fusing solution should provide a modest driving force toward fusion to avoid excessive metal mobility and/or concentration of metal ions that can tend to negatively affect the optical properties. Drying of the fusing solution can end further reaction. Fusing vapors generally comprise acid halide vapors, which can be provided from a gas reservoir or vapor emanating from a solution of the acid halide.

For the processing of the transparent conductive films, the nanowire ink can be initially deposited onto a selected substrate surface. The ink can generally applied using any reasonable process, such as spin coating, spray coatings, slot coating, knife edge coating, various printing approaches or the like. The film formed from the as-deposited nanowire ink, generally can have a high electrical resistance, which can be very desirable for patterning approaches where the as-deposited films are incorporated into the device and a non-conductive portion of the surface. With unpatterned films or some patterning approaches for the film, areas of unfused metal nanowire films may not carried forward into final films so that the corresponding properties of the unfused films may not be particularly significant. The fusing solution can be subsequently applied to the nanowire film. Upon drying of the fusing solution, the metal nanowires fuse into a film comprising a nanostructured metal network embedded in the polymer binder. It has been found that the presence of the polymer binder does not inhibit the fusing of the nanowires and the resulting fused film can have desirable values of sheet resistance, such as no more than about 300 ohm/sq and in some embodiment of no more than about 100 ohm/sq, which are within desirable ranges for transparent conductive electrodes. In some embodiments, the films following the drying of the fusing solution can have high optical transmittance, such as at least about 85% and low haze, such as no more than about 1.5%, so that the optical properties of the electrically conductive film may not be adversely affected by the presence of the polymer binder. A person of ordinary skill in the art will recognize that additional ranges of sheet resistance and optical properties within the explicit ranges above are contemplated and are within the present disclosure.

In some embodiments, patterning can be based on patterning of metal loading along the substrate surface, which can be based on subtractive processes or based on selective deposition of the metal nanowires. In general, patterning based on the metal loading on the surface of the substrate can be accomplished through printing of the ink only at selected locations and/or by selective etching of the deposited material, before or after fusing. Low metal loadings can be targeted for portions of the substrate surface where a high electrical resistance is desired. For example, an etch resist can be applied in a pattern, for example, using radiation based lithography or printing the resist in a pattern, and the metal can be etched with an appropriate wet etchant or dry etchant at exposed portions of the substrate through openings in the resist pattern. Initial patterning of the metal nanowire solution can be performed using patterned resist or the like to form a pattern with openings through which the metal nanowire ink can be printed. Similarly, some printing approaches can be used to deposit directly a patterned layer of silver nanowires, such as gravure printing, such that subsequent contact with a fusing solution/vapor results in a pattern of fused nanostructured metal network. The fusing solution can be applied to the entire surface or along the pattern of the metal nanowire deposits. At an appropriate point in the process, the resist can be removed such as through contact with an appropriate solvent or other appropriate technique. Following removal of the remaining photoresist, the substrate surface can be left with a patterned film of silver nanowires prior to fusing and/or following fusing of the nanowires. With respect to removing deposited metal, the selective removal can generally be performed before or after delivery of fusing agents.

In particular, patterning can be desirably based on selective effects of the fusing solution/vapor, and approached based on selective fusing can be effectively used to produce low visible contrast patterns with high contrast in electrical conductivity. Specifically, two general forms of patterning have been developed where the general metal loading is not significantly varying across the surface. In these approaches, the differences across the film in electrical conductivity results from the selective fusing and not generally on the loading of metal. Both of these approaches have achieved high contrast in electrical conductivity with good optical properties, for example, refractive index, haze and/or transmission, which in some embodiments can be matching or close to identical for the different portions of the pattern. Based on a selected patterning approach, high contrast between high electrical conductivity regions and electrically insulating regions result in films that can be effectively used in transparent conductive electrodes for display applications, such as touch displays.

The patterning of the fused metal nanowire regions can be accomplished through the patterning of the delivery of fusing solution, and/or a patterning based on the selective crosslinking of the polymer binder prior to delivery of the fusing solution. Locations at which the fusing solution/vapor effectively contacts the metal nanowire deposits form a fused conductive nanostructured network, while the other portions of the film not contacted with the fusing solution/vapor can remain highly electrically resistive. The patterned deposition of the fusing solution and/or vapor can be accomplished through the use of a mask, such as a resist mask, that can be deposited in a pattern, such as through screen printing or the like, through photolithography or other suitable patterning approach. Alternatively, the fusing solution can be printed in a selected pattern, such as through screen printing, inkjet printing, gravure printing or the like. Generally, the fusing solution/vapor fuses the metal nanowires into a fused nanostructured network at locations that are exposed to the fusing solution and not at locations where the fusing solution/vapor is blocked or avoided.

Furthermore, it has been discovered that the metal nanowire films with a radiation curable polymer binder can be directly patterned with respect to electrical conductivity solely with radiation. In particular, after depositing the metal nanowire ink with a radiation curable polymer binder, the surface can be subjected to patterned radiation, which can be provided with radiation through a radiation mask, a focused radiation beam appropriately scanned over the surface or other appropriate patterning approach. Subsequent to radiation exposure, the fusing solution can be added to the film with the metal nanowires and binder. The presence of the uncrosslinked binder does not inhibit the fusing of the metal nanowires to form a low electrical resistance film while the film with the crosslinked binder can remain with a high electrical resistance. It is possible that the fusing solution removes a portion of uncrosslinked polymer binder and/or some polymer associated with nanowires from their synthesis. It has been found also that the films with the metal nanowires and polymer binder can be deposited with good optical properties and very high sheet resistance, so that once the selected regions are fused, a pattern with high contrast in electrical resistance can be formed where all regions of the film, electrically conductive and high resistance, have good optical properties. The process with direct patterning of the film by patterned crosslinking of a polymer binder can reduce the number of processing steps relative to other processing approaches and provides a straightforward and effective approach to form high contrast patterns in terms of conductivity, with small contrast in optical properties that in some embodiments can be a negligible or undetectable contrast in optical properties.

Following completion of the patterning, it is generally desirable to deposit a polymer overcoat to provide further protection of the film. Also, for some embodiments, a polymer overcoat has been observed to improve the optical uniformity across the film so that patterns may be less visible. The overcoat can influence the optical interfaces and index of refraction changes upon transmission through the films. Polymer overcoats can be applied, for example, with solvent based coating techniques. Processing approaches are described herein to provide thin metal conductive grids to provide connection of the electrically conductive films to external circuits. In alternative designs, thin metal electrodes or traces are placed over a thin polymer overcoat that protects nanowire films such that current flows through the overcoat layer between the conductive film and metal electrodes. Effective approaches are described to introduce the metal traces in contact with the fused metal nanostructured network with a polymer overcoat over the metal traces as well as the conductive films and other non-conductive portions of the substrate surface. This device design can be particularly suitable for some of the processing approaches described herein. Placement of metal current collectors below the polymer overcoat facilitates the use of thicker polymer coatings that may improve film durability and reduce degradation, e.g., due to water or molecular oxygen as well as silver migration.

The transparent conductive films that are formed from the fused nanostructured metal networks are suitable for various applications. For example, some solar cells are designed to have an electrode along the light receiving surface, and a transparent conductive electrode may be desirable along this surface. Also, some display devices can be made with a transparent conductive electrode. In particular, touch inputs can be effectively formed with the transparent conductive films described herein, and the efficient patterning of the fused nanowire films can be used to form corresponding patterned touch sensors. As described further below, touch inputs or sensors generally can operate based on change of capacitance or a change of electrical resistance upon touching of the sensor surface. The processing approaches described herein can provide significant commercial applicability for the formation of transparent conductive films.

The formulation of metal nanowire inks with polymer binders and other property modifiers has allowed for the formation of ink with desirable deposition properties as well as for the formation of film with improved mechanical stability. The ink and film improvements have been achieved without significantly degrading the optical properties of the resulting films. Surprisingly, the films with the polymer binders exhibit the continued ability for deposition into a film with high electrical resistivity without impeding the ability to selectively fuse the metal nanowires into a nanostructured metal network with low sheet resistance. In addition, the use of a radiation curable polymer binder can provide the ability to effectively pattern the electrical conductivity properties of the film based simply on patterning impinging radiation on the film. Thus, the direct radiation patterning of the film can provide in some embodiments for the elimination of deposition, development, and/or subsequent removal of a photoresist with desirable results and corresponding cost and processing savings. Thus, a range of desirable commercial products and processing to form transparent conductive films suggest themselves based on the improved inks described herein.

Nanowire Inks and Fusing Agents

For embodiments of particular interest herein, film processing comprises the use of two sequential deposited materials, a metal nanowire ink and a fusing solution/vapor. The metal nanowire ink can comprise a polymer binder and optionally other property modifiers. The polymer binder can be a curable polymer, such as a radiation curable polymer, and a radiation sensitive crosslinking agent can be included in the solution to facilitate the crosslinking process. Through the use of a curable polymer, the resulting cured film can have enhanced mechanical stability as well as introducing additional patterning options. A separate fusing solution can comprise a fusing agent, such as a reducing agent or halide ions. Suitable fusing vapors can comprise acid halide vapors.

In particular, the metal nanowire solution can comprise well dispersed metal nanowires, a polymer binder, an optional crosslinking agent, an optional wetting agent, e.g. a surfactant, an optional thickener, an optional dispersant and other optional additives. The solvent can comprise an aqueous solvent, an organic solvent or mixtures thereof. In particular, suitable solvents include, for example, water, alcohols, ketones, esters, ethers, such as glycol ethers, aromatic compounds, alkanes, and the like and mixtures thereof. Specific solvents include, for example, water, ethanol, isopropyl alcohol, isobutyl alcohol, tertiary butyl alcohol, methyl ethyl ketone, glycol ethers, methyl isobutyl ketone, toluene, hexane, ethyl acetate, butyl acetate, ethyl lactate, PGMEA (2-methoxy-1-methylethylacetate), or mixtures thereof. While the solvent should be selected based on the ability to form a good dispersion of metal nanowires, the solvents should also be compatible with the other selected additives so that the additives are soluble in the solvent.

The metal nanowire ink can include from about 0.01 to about 1 weight percent metal nanowires, in further embodiments from about 0.02 to about 0.75 weight percent metal nanowires and in additional embodiments from about 0.04 to about 0.5 weight percent metal nanowires. A person of ordinary skill in the art will recognize that additional ranges of metal nanowire concentrations within the explicit ranges above are contemplated and are within the present disclosure. The concentration of metal nanowires influences the loading of metal on the substrate surface as well as the physical properties of the ink.

Polymer binders and the solvents are generally selected consistently such that the polymer binder is soluble or dispersible in the solvent. In appropriate embodiments, the metal nanowire ink generally comprises from about 0.02 to about 5 weight percent binder, in further embodiments from about 0.05 to about 4 weight percent binder and in additional embodiments from about 0.1 to about 2.5 weight percent polymer binder. In some embodiments, the polymer binder comprises a crosslinkable organic polymer, such as a radiation crosslinkable organic polymer. To facilitate the crosslinking of the binder, the metal nanowire ink can comprise from about 0.0005 wt % to about 1 wt % of a crosslinking agent, in further embodiments from about 0.002 wt % to about 0.5 wt % and in additional embodiments from about 0.005 to about 0.25 wt %. The nanowire ink can optionally comprise a rheology modifying agent or combinations thereof. In some embodiments, the ink can comprise a wetting agent or surfactant to lower the surface tension, and a wetting agent can be useful to improve coating properties. The wetting agent generally is soluble in the solvent. In some embodiments, the nanowire ink can comprise from about 0.01 weight percent to about 1 weight percent wetting agent, in further embodiments from about 0.02 to about 0.75 weight percent and in other embodiments from about 0.03 to about 0.6 weight percent wetting agent. A thickener can be used optionally as a rheology modifying agent to stabilize the dispersion and reduce or eliminate settling. In some embodiments, the nanowire ink can comprise optionally from about 0.05 to about 5 weight percent thickener, in further embodiments from about 0.075 to about 4 weight percent and in other embodiments from about 0.1 to about 3 weight percent thickener. A person of ordinary skill in the art will recognize that additional ranges of binder, wetting agent and thickening agent concentrations within the explicit ranges above are contemplated and are within the present disclosure.

In general, the nanowires can be formed from a range of metals, such as silver, gold, indium, tin, iron, cobalt, platinum, palladium, nickel, cobalt, titanium, copper and alloys thereof, which can be desirable due to high electrical conductivity. Commercial metal nanowires are available from Sigma-Aldrich (Missouri, USA), Cangzhou Nano-Channel Material Co., Ltd. (China), Blue Nano (North Carolina, U.S.A.), EMFUTUR (Spain), Seashell Technologies (California, U.S.A.), Nanocomposix (U.S.A.), ACS Materials (China), KeChuang Advanced Materials (China), and Nanotrons (USA). Silver in particular provides excellent electrical conductivity, and commercial silver nanowires are available. To have good transparency and low haze, it is desirable for the nanowires to have a range of small diameters. In particular, it is desirable for the metal nanowires to have an average diameter of no more than about 250 nm, in further embodiments no more than about 150 nm, and in other embodiments from about 10 nm to about 120 nm. With respect to average length, nanowires with a longer length are expected to provide better electrical conductivity within a network. In general, the metal nanowires can have an average length of at least a micron, in further embodiments, at least 2.5 microns and in other embodiments from about 5 microns to about 100 microns, although improved synthesis techniques developed in the future may make longer nanowires possible. An aspect ratio can be specified as the ratio of the average length divided by the average diameter, and in some embodiments, the nanowires can have an aspect ratio of at least about 25, in further embodiments from about 50 to about 10,000 and in additional embodiments from about 100 to about 2000. A person of ordinary skill in the art will recognize that additional ranges of nanowire dimensions within the explicit ranges above are contemplated and are within the present disclosure.

A range of polymer binders can be suitable for dissolving/dispersing in a solvent for the metal nanowires, and suitable binders include polymers that have been developed for coating applications. Hard coat polymers, e.g. radiation curable coatings, are commercially available, for example as hard coat materials for a range of application, that can be selected for dissolving in aqueous or non-aqueous solvents. Suitable classes of radiation curable polymers include, for example, polyurethanes, acrylic resins, acrylic copolymers, cellulose ethers and esters, polyethers, polyesters, epoxy containing polymers, and mixtures thereof. Examples of commercial polymer binders include, for example, NEOCRYL® brand acrylic resin (DMS NeoResins), JONCRYL® brand acrylic copolymers (BASF Resins), ELVACITE® brand acrylic resin (Lucite International), SANCURE® brand urethanes (Lubrizol Advanced Materials), cellulose acetate butyrate polymers (CAB brands from Eastman™), BAYHYDROL™ brand polyurethane dispersions (Bayer Material Science), UCECOAT® brand polyurethane dispersions (Cytec Industries, Inc.), MONWITOL® brand polyvinyl butyral (Kuraray America, Inc.), cellulose ethers, e.g. ethyl cellulose, polyvinyl acetates, mixtures thereof, and the like. The polymer binders can be self-crosslinking upon exposure to radiation, and/or they can be crosslinked with photoinitiator or other crosslinking agent. In some embodiments, photocrosslinkers may form radicals upon exposure to radiation, and the radicals then induce crosslinking reactions based on radical polymerization mechanisms. Suitable photoinitiators include, for example, commercially available products, such as IRGACURE® brand (BASF), GENOCURE™ brand (Rahn USA Corp.), and DOUBLECURE® brand (Double Bond Chemical Ind., Co, Ltd.), combinations thereof or the like.

Wetting agents can be used to improve the coatability of the metal nanowire inks as well as the quality of the metal nanowire dispersion. In particular, the wetting agents can lower the surface energy of the ink so that the ink spreads well onto a surface following coating. Wetting agents can be surfactants and/or dispersants. Surfactants are a class of materials that function to lower surface energy, and surfactants can improve solubility of materials. Surfactants generally have a hydrophylic portion of the molecule and a hydrophobic portion of the molecule that contributes to its properties. A wide range of surfactants, such as nonionic surfactants, cationic surfactant, anionic surfactants, zwitterionic surfactants, are commercially available. In some embodiments, if properties associated with surfactants are not an issue, non-surfactant wetting agents, e.g., dispersants, are also known in the art and can be effective to improve the wetting ability of the inks. Suitable commercial wetting agents include, for example, COATOSIL™ brand epoxy functionalized silane oligomers (Momentum Performance Materials), SILWET™ brand organosilicone surfactant (Momentum Performance Materials), THETAWET™ brand short chain non-ionic flurosurfactants (ICT Industries, Inc.), ZETASPERSE® brand polymeric dispersants (Air Products Inc.), SOLSPERSE® brand polymeric dispersants (Lubrizol), XOANONS WE-D545 surfactant (Anhui Xoanons Chemical Co., Ltd), EFKA™ PU 4009 polymeric dispersant (BASF), MASURF FP-815 CP, MASURF FS-910 (Mason Chemicals), NOVEC™ FC-4430 fluorinated surfactant (3M), mixtures thereof, and the like.

Thickeners can be used to improve the stability of the dispersion by reducing or eliminating settling of the solids from the metal nanowire inks. Thickeners may or may not significantly change the viscosity or other fluid properties of the ink. Suitable thickeners are commercially available and include, for example, CRAYVALLAC™ brand of modified urea such as LA-100 (Cray Valley Acrylics, USA), polyacrylamide, THIXOL™ 53 L brand acrylic thickener, COAPUR™ 2025, COAPUR™ 830 W, COAPUR™ 6050, COAPUR™ XS71 (Coatex, Inc.), BYK® brand of modified urea (BYK Additives), Acrysol DR 73, Acrysol RM-995, Acrysol RM-8W (Dow Coating Materials), Aquaflow NHS-300, Aquaflow XLS-530 hydrophobically modified polyether thickeners (Ashland Inc.), Borchi Gel L 75 N, Borchi Gel PW25 (OMG Borchers), and the like.

Additional additives can be added to the metal nanowire ink, generally each in an amount of no more than about 5 weight percent, in further embodiments no more than about 2 weight percent and in further embodiments no more than about 1 weight percent. Other additives can include, for example, anti-oxidants, UV stabilizers, defoamers or anti-foaming agents, anti-settling agents, viscosity modifying agents, or the like.

Processing to form the films and fused metal nanostructured networks is described further below. Fusing can be performed using an acid halide vapor and/or a fusing solution. In relevant embodiments, the initial metal nanowires films or coatings can be fused with a fusing solution that can comprise chemical fusing agents, such as halide anions, reducing agents or a combination thereof. With respect to fusing induced by dissolved halide anions, the solution can comprise dissolved acid halide, dissolved metal halide salts or a combination thereof. Suitable compositions for forming the halide solutions include, for example, HCl, HBr, HF, LiCl, CsCl, NaF, NaCl, NaBr, NaI, KCl, $MgCl_2$, $CaCl_2$, $AlCl_3$, $NH_4Cl$, $NH_4F$, AgF, or a combination thereof. In particular, NaCl, NaBr, and AgF have been observed under some conditions to provide particularly desirable fusing properties. Fusing solutions for separate application of the halide anion fusing agents generally comprise halide ions at concentrations of at least about 0.01 mM, in some embodiments, from about 0.1 mM to about 10M, in further embodiments from about 0.1 M to about 5 M. A person of ordinary skill in the art will recognize that additional ranges of concentration within the explicit ranges above are contemplated and are within the present disclosure.

For embodiments based on fusing with a reducing agent, regardless of the source of the metal ions in solution, the reducing agent can be effective to deposit metal at junction locations of adjacent metal nanowires to fuse adjacent metal nanowires to form the fused nanostructured network. Moreover, once metal ions are present, they can diffuse to areas between nanowires and can be reduced at junctions between nanowires, which result in an electrochemical Ostwald-type ripening since deposition at the junction points can be thermodynamically more favorable than deposition along the wire segments. A metal salt added to the fusing solution can comprise the same metal element or a different metal element relative to the initial metal nanowires added to the network. In this way, the joints of the fused nanostructured network can comprise the same or different metals of the initial metal nanowire components incorporated into the network. In some embodiments, it may be desirable for the joints to be formed from a different metal than the metal nanowire components that are fused into the nanostructure.

A suitable reducing agent should be able to drive the reduction of a metal ion to its elemental form: $M^{a+} \rightarrow M^0$, where M is the selected metal, "a" is the oxidation state of the metal cation and $M^0$ indicates the elemental form of the metal. It has been found that a mild reducing agent, such as certain organic compounds, can be sufficient to drive the fusing process. For example, an alcohol solvent, such as ethanol, can drive the fusing for at least some metals. The results herein suggest that the reduced metal tends to preferentially deposit at junction points of adjacent metal nanowires to facilitate formation of the fused metal nanostructured network. Selected reducing agents can be in high concentrations, for example as the solvent or a component of a solvent mixture or as a solute at a selected concentration. Various alcohols can be used as suitable reducing agents for silver, palladium, and copper. In particular, ethanol and propylene glycol have been found to be effective for the reduction of metals to form the fused metal networks. Alcohols can be oxidized to aldehydes/ketones or to carboxylic acids while correspondingly reducing the metal cations. Alternatively other reducing agents, such as organic or inorganic reducing agents can be added to the fusing solution at an appropriate concentration.

Combined systems can involve a fusing solution comprising metal halides and a reducing agent. These systems are observed to form metal halide shells over the fused metal nanostructure network. Presumably, these systems can have fusing of junctions through one or both mechanisms.

In circumstances in which the metal ions for fusing of the metal network are supplied from metal nanowire components, the fusing solution generally comprises both an oxidizing agent and a reducing agent. With respect to in situ generation of metal cations, an oxidizing acid, such as nitric acid can be used to etch, i.e., oxidize, the metal nanowires to generate metal cations. The presence of oxidizing agents and reducing agents within the solution in some sense buffers the redox (reduction-oxidation) potential of the system, and the redox agents can be balanced to achieve desired results. An excess of oxidizing agents can etch the metal more than desired, and too strong of an oxidizing agent may quench the reduction of the metal so that no fusing may occur without a separate metal ion source. If the oxidation agent and the reducing agent are reasonably balanced, metal can be etched to supply metal ions into the solution, and the reducing agent reduces the metal ions to form elemental metal that evidently preferentially accumulates at junction points of adjacent metal nanowires. During the ripening process, metal migrates gradually from the metal wires to form fused junctions. Thus, it has been observed in some embodiments that there is a net metal migration from the metal nanowire segments of the lattice to the joints of the network. While not wanting to be limited by theory, this observation strongly suggests a decrease in free energy through the migration of metal to the joints from the connected segments. The rate of fusing may be influenced by the balance of the oxidizing and reducing agents. The process can be appropriately quenched following a desired degree of fusing of the joints of the fused metal network. Quenching can be accomplished, for example, through drying, rinsing, dilution or other reasonable approaches.

In some embodiments, with respect to fusing of the metal nanowires based on reduction/oxidation chemistry, the fusing solution generally comprises a reducing agent, a metal ion source, and generally an acid, which can be an oxidizing acid. While an acid may not be contributing significantly to the fusing process, acids have been found to stabilize the fusing solutions. While the fusing solution can be combined with the metal nanowires to form a single solution for forming transparent conductive films, in embodiments of particular interest herein the fusing solution can be applied separately to a deposited metal nanowire film, which can comprise a selected polymer binder. Various solvents and combination of solvents can be used for the fusing solutions described herein. The table below provides a list of solvent with properties of the solvents outlined in detail, and additional solvents include, for example, methanol, butanediol, hydroxylacetone, mixtures thereof, mixtures with the solvents in the following table and mixtures of solvents listed in the table.

| Name | Structure | Boiling Point (° C.) | Density (g/cm$^3$) | Viscosity (cP) | Polarity index ($H_2O$ = 9)/ Dipole Moment (D) | Surface Tension (mN/m) |
|---|---|---|---|---|---|---|
| Ethanol | ∧OH | 78 | 0.79 | 1.0 (20° C.) | 5.2 | 22.0 |
| IPA | OH | 83 | 0.79 | 1.96 (25° C.) | 3.9 | 21.7 |
| 1-Butanol | ∧∧OH | 119 | 0.81 | 2.94 (20° C.) | 4 | 24.2 |
| 2-Butanol | OH | 99 | 0.81 | 3.7 (25° C.) | <4 | 23.0 |

| Name | Structure | Boiling Point (° C.) | Density (g/cm³) | Viscosity (cP) | Polarity index (H₂O = 9)/ Dipole Moment (D) | Surface Tension (mN/m) |
|---|---|---|---|---|---|---|
| Isobutanol | 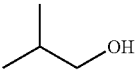 | 108 | 0.80 | 3.95 (20° C.) | | |
| Propylene Glycol | 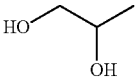 | 188 | 1.04 | 48.6 (25° C.) | | 36 |

In some embodiments, the fusing solution can comprise a metal salt or a combination thereof. In general, the metal ion in the salt can be the same metal element as the metal element of the nanowires or a different metal element. In general, the metal element can be selected as desired and corresponds with a metal having good electrical conductivity. Suitable metal ions include, for example, ions of silver ($Ag^+$), copper ($Cu^{+2}$), gold ($Au^{+3}$), palladium ($Pd^{+2}$), lead ($Pb^{+2}$) aluminum ($Al^{+3}$), nickel ($Ni^{+2}$ or $Ni^{+3}$), cobalt ($Co^{+2}$ or $Co^{+3}$), zinc ($Zn^{+2}$), iron ($Fe^{+2}$ or $Fe^{+3}$), tin ($Sn^{+2}$ or $Sn^{+4}$), or a mixture thereof. In general, the salts can comprise a halide anion, e.g. (AgF), and/or have an anion to provide desired solubility and/or reactivity. Suitable anions can comprise bases of carboxylic acids, e.g., acetate, trifluoromethane sulfonate (TMS), heptafluorobutyrate (FHB), and hexafluoroantimonate (HFA), combinations thereof or the like. The anion can correspond to an oxidizing acid, e.g., nitrate, perchlorate and/or sulfate, to provide desired functionality to the fusing solution. With respect to fusing solutions comprising metal ions, the fusing solution can comprise metal ions generally from about 0.000001M to about 1M, in further embodiments from about 0.00001M to about 0.1M, and in additional embodiments from about 0.0001M to about 0.01M. In some embodiments, the metal ions can be generated in situ through the oxidation of metal nanowires. A person of ordinary skill in the art will recognize that additional ranges of metal ion concentrations within the explicit ranges above are contemplated and are within the present disclosure.

For systems with reduction/oxidation based fusing, the fusing solution can comprise an acid to adjust the acid concentration or pH. The acid concentration/pH may influence the reduction potentials, solubilities of reactants, solution stabilities and other properties. Generally, the fusing solutions have a pH adjusted through the addition of an acid, and the pH can be from about 0.5 to about 6, in further embodiments from about 1 to about 5.5 and in other embodiments from about 1.5 to about 5. With respect to acid concentrations, an acid, e.g., a strong acid, can be added generally in concentrations at least about 0.000001M, in further embodiments from about 0.0000025M to about 0.05M and in additional embodiments from about 0.000005M to about 0.01M. While not wanting to be limited by theory, the acids may also remove at least some surface coating polymers, such as polyvinylperolidone (PVP) that may be coating commercial nanowires. Suitable acids can include weakly oxidizing acids (i.e., moderate oxidizing activity from $H^+$ ions), such as HCl, phosphoric acid, carboxylic acids, $RSO_3H$ (sulfonic acid), polysulfonic acid, or combinations thereof. Suitable strong oxidizing acids generally lower the pH while providing a significant oxidizing agent based on the anion, which can influence the potentials in the fusing solution and can be used to etch metal nanowires as a metal ion source. Suitable strong oxidizing acids include, for example, $HNO_3$ (nitric acid), $H_2SO_4$ (sulfuric acid), $HClO_4$ (perchloric acid), mixtures thereof and the like. A person of ordinary skill in the art will recognize that additional ranges of pH and acid concentrations within the explicit ranges above are contemplated and are within the present disclosure.

The reducing agent can be provided as the solvent and/or as an additive to the solvent. For example, some alcohols can be useful as a reducing agent. For the fusing solutions described herein, suitable alcohols include, for example, methanol, ethanol, isopropanol, isobutanol, 2-butanol, propylene glycol, sugars and mixtures thereof. Ethanol can be oxidized to form acetaldehyde or acetate while reducing a metal ion to the elemental metal, and other alcohols can be similarly oxidized when functioning as a reducing agent. When a reducing agent is provided as additive to the solvent, a wide range of organic and inorganic compounds can be used. In general, the reducing power of the compound can be a not very strong one, on the basis that a stable fusing solution is desirable. On the other hand, the reducing agent can be selected to be strong enough to reduce the silver and/or other metal ions to elemental metal under the condition of the fusing step. Inorganic and organometallic compounds, typically metal salts and complexes, can be used when they are soluble in the fusing solution solvent. Useful salts include, for example, nitrate or sulfate salts and complexes of metal ions such as $V^{2+}$, $Fe^{2+}$, $Cr^{2+}$, $Sn^{2+}$, $Ti^{3+}$, and the like. Other inorganic reducing agents useful for fusing solutions are alkaline metal, ammonium or other salts of oxidizable anions, such as sulfite, hydrosulfite, thiosulfate, phosphite, hydrogenphosphite, oxalate, formate, or the like or combinations thereof. Furthermore, nanoparticle suspensions of reducing metal, e.g., zinc, iron, aluminum, magnesium, and the like, may be used in appropriate amount as reducing agents.

Organic reducing agents, in addition to those that also function as solvent, can be used in some embodiments. Suitable organic reducing agents include but not limited to phenolic compounds, such as phenol, aminophenol, hydroquinone, pyrogallol, catechol, phenidone, 4-amino-3-hydroxy-1-naphthalenesulfonic acid, and the like; polyols including sugar alcohols; sugars, such as mono-saccharides and disaccharides; hydroxylamine and derivatives; aldehydes; α-hydroxy carbonyl compounds such as hydroxyketones like benzoin, furoin, hydroxyacetone; hydrazide derivatives such as phthalhydrazide, adipic acid dihydrazide, phenidone, and the like; reduced aromatic compounds such as 1-methyl-1,4-cyclohexadiene, dihydrodiazine, and the like; and combinations thereof. In general, a reducing agent can be incorporated into the fusing solution at a concentration from about 0.001 mM to about 1000 mM, in further embodiments from about 0.01 mM to about 100 mM, and in additional embodiments from about 0.1 mM to about 10 mM, and a desired concentration generally is influenced by the chemistry of a selected agent or combination of agents and a person of ordinary skill in the art can evaluate these issue empirically based on the teachings herein. A person of ordinary skill in the art will recognize that additional ranges of reducing agent concentrations within the explicit ranges above are contemplated and are within the present disclosure. If an organic additive is supplied as a reducing agent, various solvents can be suitable, such as isopropyl alcohol, isobutyl alcohol, formaldehyde, acetone, other ketones, other aldehydes, mixtures thereof, and the like.

Fusing solutions based on alkaline chemistry generally comprise a compound that has an alkaline pH upon dissolving into the solvent. Suitable solvents can be aqueous solvents, such as water or mixtures of water and a solvent soluble in water, or polar organic liquids such as alcohols. Suitable basic compositions can comprise hydroxide compositions, such as ammonium hydroxide, metal hydroxides, or mixtures thereof. Generally, the base compositions are added in an amount to have a pH that is at least about 9.5 pH units, in further embodiments at least about 10 pH units and in other embodiments from about 10.5 pH units to about 13 pH units. With respect to base concentrations, an alkaline composition, e.g., a hydroxide, can be added generally in concentrations at least about 0.00003M, in further embodiments from about 0.00005M to about 0.5M and in additional embodiments from about 0.0001M to about 1M. The alkaline fusing solutions can also advantageously comprise a metal salt. The fusing solutions can also comprise property modifying compositions, which may be useful to provide a solution suitable for a selected delivery approach.

Processing to Form Transparent Electrically Conductive Films and Film Structure

In embodiments of particular interest, a process is used in which a sparse nanowire film is initially dispersed and subsequent processing provides for the fusing of the metal nanowires into a metal nanostructured network, which is electrically conducting. The fusing process can be performed with controlled exposure to a fusing vapor and/or through the deposition of a fusing solution. Fused nanostructured metal films are generally formed on a selected substrate surface. In general, the films, both fused and prior to fusing, have good optical properties, including transparency and low haze. Processing can be adapted for patterning of the film as described further below. A polymer overcoat can be applied over the conductive film, whether or not patterned, to provide a protective cover and the polymer can be selected to maintain optical transparency.

In general, suitable substrates can be selected as desired based on the particular application. Substrate surfaces can comprise sheets of, for example, polymers, glass, inorganic semiconductor materials, inorganic dielectric materials, polymer glass laminates, composites thereof, or the like. Suitable polymers include, for example, polyethylene terephthalate (PET), polyethylene naphthalate (PEN), polyacrylate, poly(methyl methacrylate), polyolefin, polyvinyl chloride, fluoropolymer, polyamide, polyimide, polysulfone, polysiloxane, polyetheretherketone, polynorbornene, polyester, polystyrene, polyurethane, polyvinyl alcohol, polyvinyl acetate, acrylonitrile-butadiene-styrene copolymer, polycarbonate, a copolymer thereof or blend thereof or the like. Furthermore, the material can have a polymer overcoat placed on the fused metal nanowire network, and the overcoat polymers can comprise the polymers listed for the substrates above. Moreover, other layers can be added on top or in between the conductive film and substrate to reduce reflective losses and improve the overall transmission of the stack.

For the deposition of the metal nanowire ink, any reasonable deposition approach can be used, such as dip coating, spray coating, knife edge coating, bar coating, Meyer-rod coating, slot-die, gravure printing, spin coating or the like. The ink can have properties, such as viscosity, adjusted appropriately with additives for the desired deposition approach. Similarly, the deposition approach directs the amount of liquid deposited, and the concentration of the ink can be adjusted to provide the desired loading of metal nanowires on the surface. After forming the coating with the dispersion, the nanowire network can be dried to remove the liquid. Drying may or may not be performed prior to performing the fusing process.

A first approach to fusing can be performed with acid halide vapor, such as vapor from HCl, HBr, HI or mixtures thereof. HF can also be used, but HF may be corrosive to some substrate materials and is more toxic. Specifically, the dried coating can be exposed to the vapor of the acid halide for a brief period of time. The hydrogen halide compounds are gaseous and are soluble in water and other polar solvents such as alcohol. Generally, the vapor for fusing the metal nanowire film can be generated from a gas reservoir, from vapor given off by solutions of the hydrogen halide compounds, and/or from another source. Acidic vapors can quickly be passed over the coating surfaces for example for about 10 s to form the nanowire network. In general, the coating containing the nanowires can be treated with acid vapor for no more than about 4 minutes, in further embodiments for from about 2 seconds to about 3.5 minutes and in other embodiments from about 5 seconds to about 3 minutes. Also, acid generating compounds, for example photo-acids or photo-acid generators can be incorporated. These chemicals can generate the desired acid (for example HCl) after exposure to irradiation. Such chemistries can thus be used for patterning. Polymeric HCl photogenerators include polychloromethylstyrenes, copoly(chloromethylstyrene-styrene) (e.g., from Sigma-Aldrich), copoly(chloromethylstyrene-acrylated methyl styrene), copoly(chloromethyl styrene-dimethylaminoethylacrylated methyl styrene) or copoly(chloromethylstyrene-trimethylaminoethylacrylated methyl styrene) and the like that can photochemically generate HCl upon exposure to radiation. Also, small molecule HCl photo-releasing compounds are useful such as 2-(4-Methoxystyryl)-4,6-bis(trichloromethyl)-1,3,5-triazine (Sigma-Aldrich). A person of ordinary skill in the art will recognize that additional ranges of treatment times are contemplated and are within the present disclosure.

With respect to the use of a fusing solution or solutions, the fusing solution can similarly be applied using any reasonable deposition approach, although different deposition approaches may be more readily useful with respect to the different solutions. Fusing solutions can be deposited, for example, using spray coating, dip coating, spin coating, blade coating, gravure printing, inkjet printing, and the like. In some embodiments, it is believed that fusing occurs during the drying of the fusing solution in which the drying process increases metal ion concentrations. As the material dries, it is believed that liquid can pool to areas of lower chemical potential in the film between nanostructures. The films can be dried, for example, with a heat gun, an oven, a thermal lamp or the like, although the films that can be air dried can be desired in some embodiments. In some embodiments, the films can be heated to temperatures from about 50° C. to about 100° C. during drying. After drying, the films can be washed one or more times, for example, with an alcohol or other solvent or solvent blend, such as ethanol or isopropyl alcohol, to removed excess solids to lower haze. In general, the fusing is believed to be a low temperature process, and any heat application to facilitate drying is incidental to the fusing. Clear evidence can be found in the patterning results in which the heat application does not increase electrical conductivity of regions free of the fusing solution.

Following fusing of the metal nanowires into a network, the individual nanowires generally are no longer present, although the physical properties of the nanowires used to form the network can be reflected in the properties of the fused metal nanostructured network. The metal fusing is believed to contribute to the enhanced electrical conductivity observed and to the good optical properties achievable at low levels of electrical resistance. The fusing is believed to take place at points of near contact of adjacent nanowires during processing. Thus, fusing can involve end-to-end fusing, side wall to side wall fusing and end to side wall fusing. The degree of fusing may relate to the processing conditions. Adjustment of processing conditions can be used to achieve good fusing without degradation of the nanowire network, such that desirable film properties can be achieved.

The amount of nanowires delivered onto the substrate can involve a balance of factors to achieve desired amounts of transparency and electrical conductivity. While thickness of the nanowire network can in principle be evaluated using scanning electron microscopy, the network can be relatively sparse to provide for optical transparency, which can complicate the measurement. In general, the fused metal nanowire network would have an average thickness of no more than about 5 microns, in further embodiments no more than about 2 microns and in other embodiments from about 10 inn to about 500 nm. However, the fused nanowire networks are generally relatively open structures with significant surface texture on a submicron scale, and only indirect methods can generally be used to estimate the thickness. The loading levels of the nanowires can provide a useful parameter of the network that can be readily evaluated, and the loading value provides an alternative parameter related to thickness. Thus, as used herein, loading levels of nanowires onto the substrate is generally presented as milligrams of nanowires for a square meter of substrate. In general, the nanowire networks can have a loading from about 0.1 milligrams (mg)/m$^2$ to about 300 mg/m$^2$, in further embodiments from about 0.5 mg/m$^2$ to about 200 mg/m$^2$, and in other embodiments from about 1 mg/m$^2$ to about 150 mg/m$^2$. A person of ordinary skill in the art will recognize that additional ranges of thickness and loading within the explicit ranges above are contemplated and are within the present disclosure.

A polymer overcoat or layer can be desirable to place over the metal layer, which may or may not be patterned. In general, the polymer binders can be adapted for use as polymer overcoats, although additional polymers can be used. Also, with respect to processing, the polymer overcoats can be applied using solutions coating techniques, or other processing approaches such as extrusion, lamination, calendering, melt coating techniques or the like. For solution processed overcoats, the various coating approaches described above, can be equally applied to these layers. However, the solution processing of a polymer overcoat can be directed to solvents that are not necessarily compatible with forming good dispersions of metal nanowires.

In general, the polymer overcoats can have average thicknesses from about 50 nanometers (nm) to about 25 microns, in further embodiments, from about 75 nm to about 15 microns and in additional embodiments from about 100 nm to about 10 microns. A person of ordinary skill in the art will recognize that additional ranges of overcoat thicknesses within the explicit ranges above are contemplated and are within the present disclosure. In some embodiments, it may be possible to select an overcoat by choice of the refractive index and thickness such that after application of the overcoat the pattern of conductive and insulating areas is less visible. Overcoats may contain conductive particles, which can have average particle diameters in the range from about 3 nm-20 microns. The particles, i.e. conductive elements, can range from 0.0001-1.0 wt % of the coating solution which generally has between about 0.1-80% by weight solid. These particles can be composed of metals or metal coatings, metal oxides, conductive organic materials, and conductive allotropes of carbon (carbon nanotubes, fullerenes, graphene, carbon fibers, carbon black or the like) and mixtures of aforementioned materials. While the overcoats should not achieve a high level of electrical conductivity, these conductive particles can allow for thicker overcoats to be deposited and still allow for electrical conductivity to trace electrodes. Furthermore, the overcoat layer can be deposited on the conductive or patterned film after the trace electrodes are deposited. This allows for a thicker overcoat to be used with corresponding stabilization advantages while still allowing for electrical conductivity to be maintained between the transparent conductive layer and the silver (or other) bus bars.

The overcoats may or may not cover the entire substrate surface. In general, the polymers can be selected for the overcoat to have good optical transparency. In some embodiments, the optical properties of the films with the polymer overcoat are not significantly different from the optical properties described above for the electrically conductive film. Also, it has been found that for patterning by fusing of the metal nanowires through patterning of the binder cross-linking, the deposition of a polymer overcoat can facilitate forming a less visible pattern at the end of the processing, and the resulting pattern with overcoat can be approximately transparent in normal room lighting.

Film Electrical and Optical Properties

The fused metal nanostructured networks can provide low electrical resistance while providing good optical properties. Thus, the films can be useful as transparent conductive electrodes or the like. The transparent conductive electrodes can be suitable for a range of applications such as electrodes along light receiving surfaces of solar cells. For displays and in particular for touch screens, the films can be patterned to provide electrically conductive patterns formed by the film. Corresponding unfused metal nanowire films can have very high electric resistance and good optical properties, while providing a suitable film for fusing into a film with low values of electrical resistance. Patterning is described further below with respect to details of several different patterning approaches, but the patterned films can have a high contrast with respect to the difference in electrical resistance for different sections of the pattern. The substrate with the patterned film, generally has good optical properties at the respective portions of the pattern. However, the visibility of the pattern can vary depending on the patterning approach.

Electrical resistance of thin films can be expressed as a sheet resistance, which is reported in units of ohms per square ($\Omega/\square$ or ohms/sq) to distinguish the values from bulk electrical resistance values according to parameters related to the measurement process. Sheet resistance of films is generally measured using a four point probe measurement or an equivalent process. In the Examples below, film sheet resistances were measured using a four point probe, or by making a square using a quick drying silver paste to define a square. The fused metal nanowire networks can have a sheet resistance of no more than about 300 ohms/sq, in further embodiments no more than about 200 ohms/sq, in additional embodiments no more than about 100 ohms/sq and in other embodiments no more than about 60 ohms/sq. A person of ordinary skill in the art will recognize that additional ranges of sheet resistance within the explicit ranges above are contemplated and are within the present disclosure. Depending on the particular application, commercial specifications for sheet resistances for use in a device may not be necessarily directed to lower values of sheet resistance such as when additional cost may be involved, and current commercially relevant values may be for example, 270 ohm/sq, versus 150 ohms/sq, versus 100 ohms/sq, versus 50 ohms/sq, versus 40 ohms/sq, versus 30 ohms/sq or less as target limits for different quality touch screens. Thus, lower cost films may be suitable for certain applications in exchange for modestly higher sheet resistance values. In general, sheet resistance can be reduced by increasing the loading of nanowires, but an increased loading may not be desirable from other perspectives, and metal loading is only one factor among many for achieving low values of sheet resistance.

For applications as transparent conductive films, it is desirable for the fused metal nanowire networks to maintain good optical transparency. In principle, optical transparency is inversely related to the loading with higher loadings leading to a reduction in transparency, although processing of the network can also significantly affect the transparency. Also, polymer binders and other additives can be selected to maintain good optical transparency. The optical transparency can be evaluated relative to the transmitted light through the substrate. For example, the transparency of the conductive film described herein can be measured by using a UV-Visible spectrophotometer and measuring the total transmission through the conductive film and support substrate. Transmittance is the ratio of the transmitted light intensity (I) to the incident light intensity ($I_o$). The transmittance through the film ($T_{film}$) can be estimated by dividing the total transmittance (T) measured by the transmittance through the support substrate ($T_{sub}$). ($T=I/I_o$ and $T/T_{sub}=(I/I_o)/(I_{sub}/I_o)=I/I_{sub}=T_{film}$) Thus, the reported total transmissions can be corrected to remove the transmission through the substrate to obtain transmissions of the film alone. While it is generally desirable to have good optical transparency across the visible spectrum, for convenience, optical transmission can be reported at 550 nm wavelength of light. Alternatively or additionally, transmission can be reported as total transmittance from 400 nm to 700 nm wavelength of light, and such results are reported in the Examples below. In general, for the fused metal nanowire films, the measurements of 550 nm transmittance and total transmittance from 400 nm to 700 nm (or just "total transmittance" for convenience) are not qualitatively different. In some embodiments, the film formed by the fused network has a total transmittance of at least 80%, in further embodiments at least about 85%, in additional embodiments, at least about 90%, in other embodiments at least about 94% and in some embodiments from about 95% to about 99%. Transparency of the films on a transparent polymer substrate can be evaluated using the standard ASTM D1003 ("Standard Test Method for Haze and Luminous Transmittance of Transparent Plastics"), incorporated herein by reference. A person or ordinary skill in the art will recognize that additional ranges of transmittance within the explicit ranges above are contemplated and are within the present disclosure.

Also, the correlation of good optical transparency with low electrical resistance can be particularly desirable. In some embodiments with a sheet resistance from 10 ohm/sq to about 150 ohm/sq, the films can have a total transmittance of at least about 86%, in further embodiments at least about 88% and in other embodiments from about 90% to about 99%. In further embodiments, the film can have a sheet resistance from about 40 ohm/sq to about 125 ohm/sq and a total transmittance from about 91% to about 98.5%. In another embodiment, the film can have a sheet resistance of no more than about 175 ohm/sq and a total transmittance of at least about 90%. A person or ordinary skill in the art will recognize that additional ranges of optical transmission within the explicit ranges above are contemplated and are within the present disclosure.

The fused metal networks can also have low haze along with high transmission of visible light while having desirably low sheet resistance. Haze can be measured using a hazemeter based on ASTM D1003 referenced above, and the haze contribution of the substrate can be removed to provide haze values of the transparent conductive film. In some embodiments, the sintered network film can have a haze value of no more than about 1.2%, in further embodiments no more than about 1.1%, in additional embodiments no more than about 1.0% and in other embodiments from about 0.9% to about 0.5%. A person of ordinary skill in the art will recognize that additional ranges of haze within the explicit ranges above are contemplated and are within the present disclosure.

Another feature of the optical properties of the film relates to patterned films, specifically films patterned to have regions of good electrical conductivity, i.e., low electrical resistance, and other regions of high electrical resistance. While certain patterning approaches provide for films with good optical transparency at all regions of the film, the pattern itself can be detected visually by a standard human observer in normal room light looking at the well illuminated film on a transparent substrate. In particular, if the patterning is based mostly or exclusively on changes in metal loading over the different regions of the substrate, the pattern is generally readily visible by observation. However, patterning based on selective fusing, as described further below, can result in a pattern that can be essentially invisible to detect by a human observer in normal white room light. The availability of an invisible pattern can be desirable for certain applications.

Patterning

The introduction of electrical conductivity through fusing of metal nanowires into a conductive nanostructured network has led to the discovery of a flexible collection of effective patterning approaches. The formulation of the films with a radiation crosslinkable polymer binder has surprisingly resulted in the ability to pattern through the selective crosslinking of the polymer prior to contacting the film with a fusing solution. Thus, overall patterning can be described in three general categories, patterning based on metal loading, patterning based on patterned delivery of fusing agent, and patterning based on curing of a polymer binder prior to delivery of fusing solution. A particular patterning approach can be selected to achieve desired processing objectives and properties of the resulting patterned films.

A particular pattern of fused conductive metal nanostructured network along the substrate surface generally is guided by the desired product. In other words, the electrically conductive pattern generally introduces functionality, such as domains for a touch screen or the like. Of course, for some product, the entire surface can be electrically conductive, and for these application pattern generally is not performed. For embodiments involving patterning, the proportion of the surface comprising the electrically conductive fused metal nanostructured network can generally be selected based on the selected design. In some embodiments, the fused network comprises from about 0.5 percent to about 99 percent of the surface, in further embodiments from about 5 percent to about 85 percent and in additional embodiment from about 10 percent to about 70 percent of the substrate surface. A person of ordinary skill in the art will recognize that additional ranges of surface coverage within the explicit ranges above are contemplated and are within the present disclosure.

Figure 2:
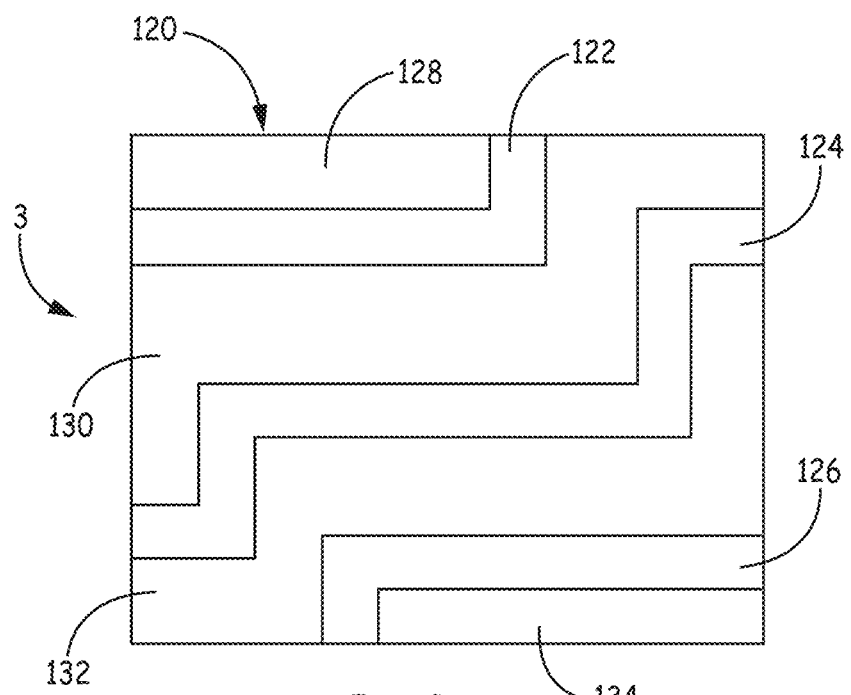
FIG. 2 is a schematic diagram showing fused metal nanostructured films along the substrate surface forming a conductive pattern with a plurality of electrically conductive pathways.
Figure 3:
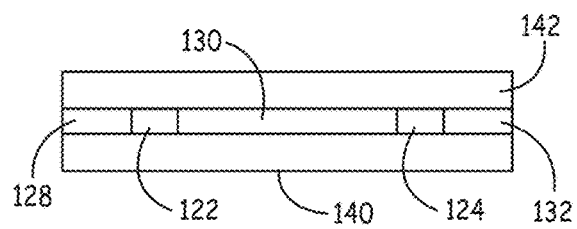
FIG. 3 is a side view of the substrate and fused films of FIG. 2 taken along arrow 3 in which a polymer overcoat is placed over the electrically conductive film.

As schematic examples, a fused metal nanostructured network can form a conductive pattern along a substrate surface 100 with a single conductive pathway 102 surrounded by electrically resistive regions 104, 106, as shown in FIG. 1 or patterns along a substrate surface 120 with a plurality of electrically conductive pathways 122, 124, and 126 surrounded by electrically resistive regions 128, 130, 132, 134, as shown in FIG. 2. As shown in FIG. 2, the fused area correspond with three distinct electrically conductive regions corresponding with electrically conductive pathways 122, 124, and 126. A side view of the structure with the patterned film of FIG. 2 is shown in FIG. 3 on a polymer substrate 140 with a polymer overcoat 142. Although a single connected conductive region and three independently connected conductive regions have been illustrated in FIGS. 1-3, it is understood that patterns with two, four or more than 4 conductive independent conductive pathways or regions can be formed as desired. For many commercial applications, fairly intricate patterns can be formed with a large number of elements. In particular, with available patterning technology adapted for the patterning of the films described herein, very fine patterns can be formed with highly resolved features. Similarly, the shapes of the particular conductive regions can be selected as desired.

Figure 4:
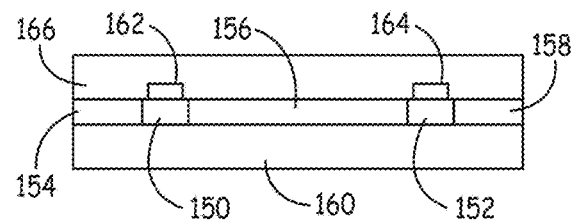
FIG. 4 is a side view of an alternative embodiment of a substrate and fused films in which electrically conductive metal leads are patterned under an overcoat.
Figure 5:
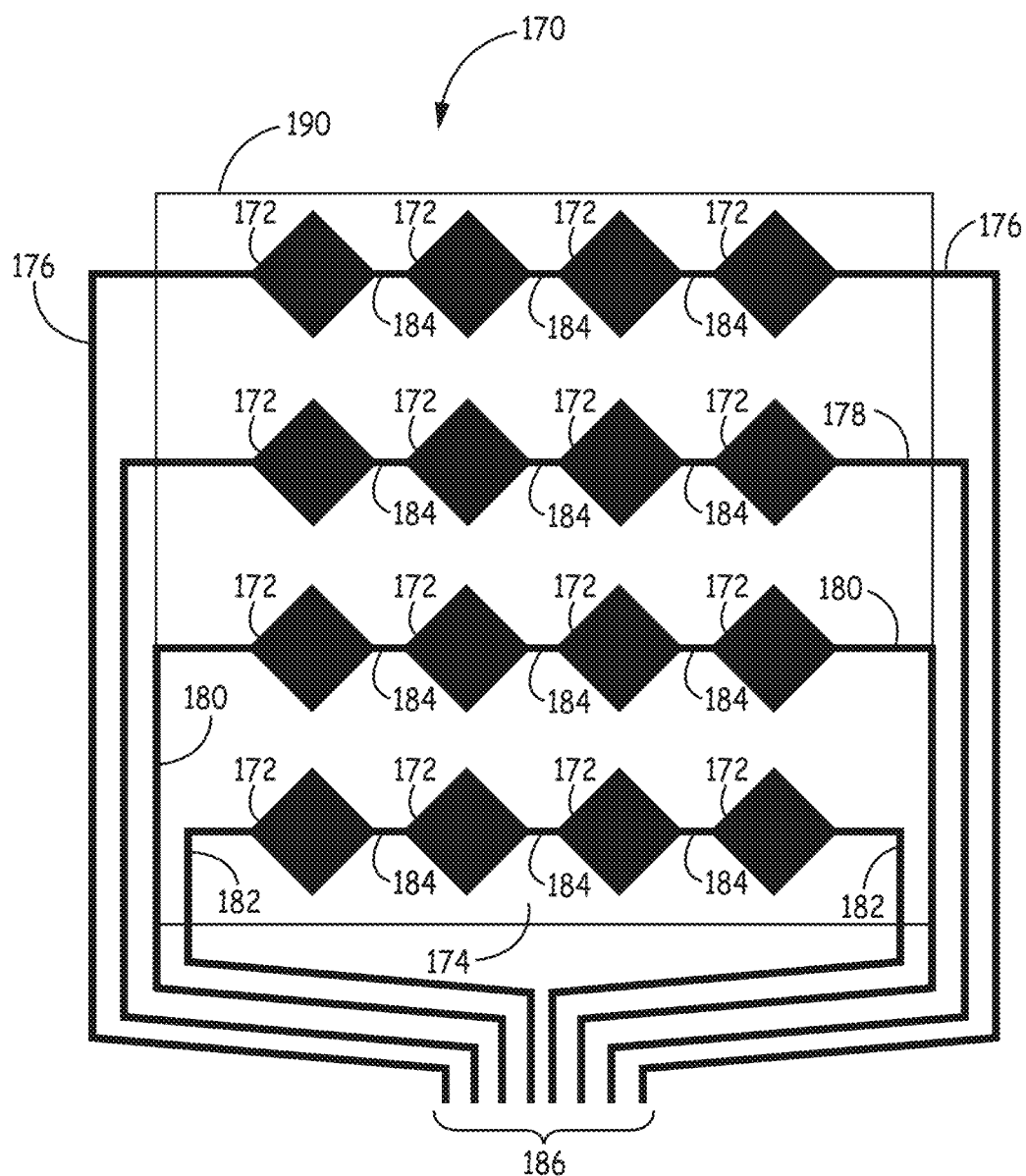
FIG. 5 is a top view of a patterned film with metal traces and a polymer overcoat configured for incorporation into a touch screen or other sensor device.

An alternative embodiment is shown in FIG. 4 with metal electrodes placed under the overcoat in contact with the electrically conductive fused metal networks. Referring to FIG. 4, fused metal nanostructured networks 150, 152 are separated by electrically resistive regions 154, 156, 158. The films represented by networks 150, 152 are supported on substrate 160. Metal electrodes 162, 164 provide electrical connection of conductive networks 150, 152 to appropriate circuits. Polymer overcoat 166 covers and protects conductive networks 150, 152 as well as metal electrodes 162, 164. Since the metal electrodes 162, 164 are under the overcoat, a thicker overcoat can be used if desired without adversely changing performance due to electrical insulating effects of the overcoat. A schematic view of the top of a thin conductive film integrated into a sensor design is shown in FIG. 5. Sensor 170 comprises conductive metal nanostructured film sections 172, which are displayed as turned squares, separated by an insulating region 174, which may or may not comprise unfused metal nanowires. Metal traces 176, 178, 180, 182 each connect rows of conductive films 172. Metal traces 176, 178, 180, 182 comprise connective segments 184 between adjacent conductive film sections 172 as well as conductive sections that are directed to a connection zone 186 at an edge of the sensor where the metal traces can be connected to an electrical circuit. A polymer overcoat 190 is placed over the conductive film.

The difference between the electrical conductivity of the fused metal network regions of the surface and the un-fused nanowire regions can provide desired functionality. In general, the variation or contrast in electrical conductivity between the fused regions and the un-fused regions can be very large, as described in the examples. In general, the un-fused metal nanowire regions have a sheet resistance that is at least about 10 times the sheet resistance of the fused metal network, in further embodiments at least about 100 times, in additional embodiments at least about 1000 times, and in other embodiments at least about 1,000,000 or greater times the sheet resistance of the fused metal network (e.g., up to at least $10^9$ Ohms/sq or greater). High resistance measurements can be made, e.g., on unfused networks or bare polymer substrate, by first painting silver paste onto the surface of the samples to define a square. The sample can then be annealed at roughly 120° C. for 20 minutes in order to cure and dry the silver paste. Alligator clips are connected to the silver paste, and the leads can be connected to a suitable high resistance measurement device, such as an AlphaLabs High Resistance Low Conductance Meter under electrical shielding. The instrument can measure up to 1999 gigaohms A person of ordinary skill in the art will recognize that additional ranges within the explicit ranges above are contemplated and are within the present disclosure.

Patterning based on metal loading can involve selective deposition of the metal nanowire inks over selected portions of the substrate surface and/or selective removal of the deposited metal nanowire or nanostructured films. Patterning during deposition is described above in the context of depositing the metal nanowire inks. If the metal nanowire inks are deposited over only selected locations, the fusing solution/vapor can be contacted over the whole surface since the locations lacking the metal nanowires do not become conductive if contacted with the fusing solution/vapor. If the metal nanowire ink is deposited over the substrate surface, selected regions can be developed to remove metal from the regions before or after fusing, as well as before or after curing of the polymer binder. The metal can be removed through an appropriate etching or washing or other suitable process. For example, laser ablation of metal nanowires is described in Japanese patent 5289859B to Nissha Printing Co. Ltd., entitled "Method of Manufacturing Conductive Pattern-Covered Body, and Conductive Pattern Covered Body," incorporated herein by reference. If the nanowires are not fused, a washing step may be suitable to remove the nanowires. If the nanowires are fused, an acid etching agent or other suitable wet etchant can be used. Dry etching can also be performed. The patterning of the etching/development can be performed using a resist composition or the like. A wide range of resists, such as photoresists can be used for patterning and are commercially available. Photolithography using light, e.g., UV light, or electron beams can be used to form high resolution patterns, and the patterning of the metal nanowire or nanostructured films can be accomplished by etching through windows forming the resist. Both positive tone and negative tone photoresists can be used. Patterning using a resist can be performed using photolithography in which radiation exposure and development re performed to pattern the resist. Alternatively or additionally, a resist can be printed, such as with screen printing or gravure printing, to pattern the resist to accomplish the patterning processed described herein. Generally, for embodiments in which the electrically insulating region has less metal loading than the electrically conductive regions, the electrically insulating regions can have at least a factor of 1.5 less metal loading, in some embodiments at least a factor of 5 less metal loading, in further embodiments at least a factor of 10 lower metal loading and in other embodiments at least a factor of 20 less metal loading relative to the electrically conductive regions. In some embodiments, the electrically insulating regions can be approximately devoid of metal. A person of ordinary skill in the art will recognize that additional ranges of decreased metal loadings within the explicit ranges above are contemplated and are within the present disclosure.

With respect to patterning based on patterned delivery of the fusing solution/vapor, the metal loading generally can be approximately uniform across the substrate surface. At locations in which the fusing solution/vapor contacts the metal nanowires, the nanowires fuse into a nanostructured network that can have a low electrical resistance, and at locations where the fusing solution/vapor does not contact the metal nanowire film, the nanowires remain unfused with a high electrical resistance. A fusing vapor can be patterned using a vapor blocking mask, such as an appropriately selected resist. A fusing solution can be patterned through selective printing, such as screen printing, gravure printing or inkjet printing, or through coating with mask present, such as a resist. A photoresist can be used for patterning, in which the fusing solution/vapor is delivered through windows in the photoresist after development of the photoresist radiation image. Following completion of the fusing, any mask can be removed. Common positive tone photoresists can be used, such as FujiFilm OCG825, TOK THMR-i-P5680 and the like, and negative tone photoresist Micro Resist Technology MR-N 415 and the like. With direct printing such as inkjet printing of the fusing solution, resist masks can be avoided and the number of processing steps is reduced. The additive patterning approaches in which the selective effect of the fusing solution is used to form the pattern provides for a high degree of visible similarity between the conductive and electrically resistive regions of the film as well as providing potentially convenient processing options that are available due to the fusing approach.

The approaches based on patterning of the metal nanowire film and the patterning of the fusing solution can be combined. In particular, it can be useful to perform cruder patterning of the metal nanowire ink, such as covering only one large section of the substrate, and then perform more refined patterning with the fusing solution.

Figure 6:
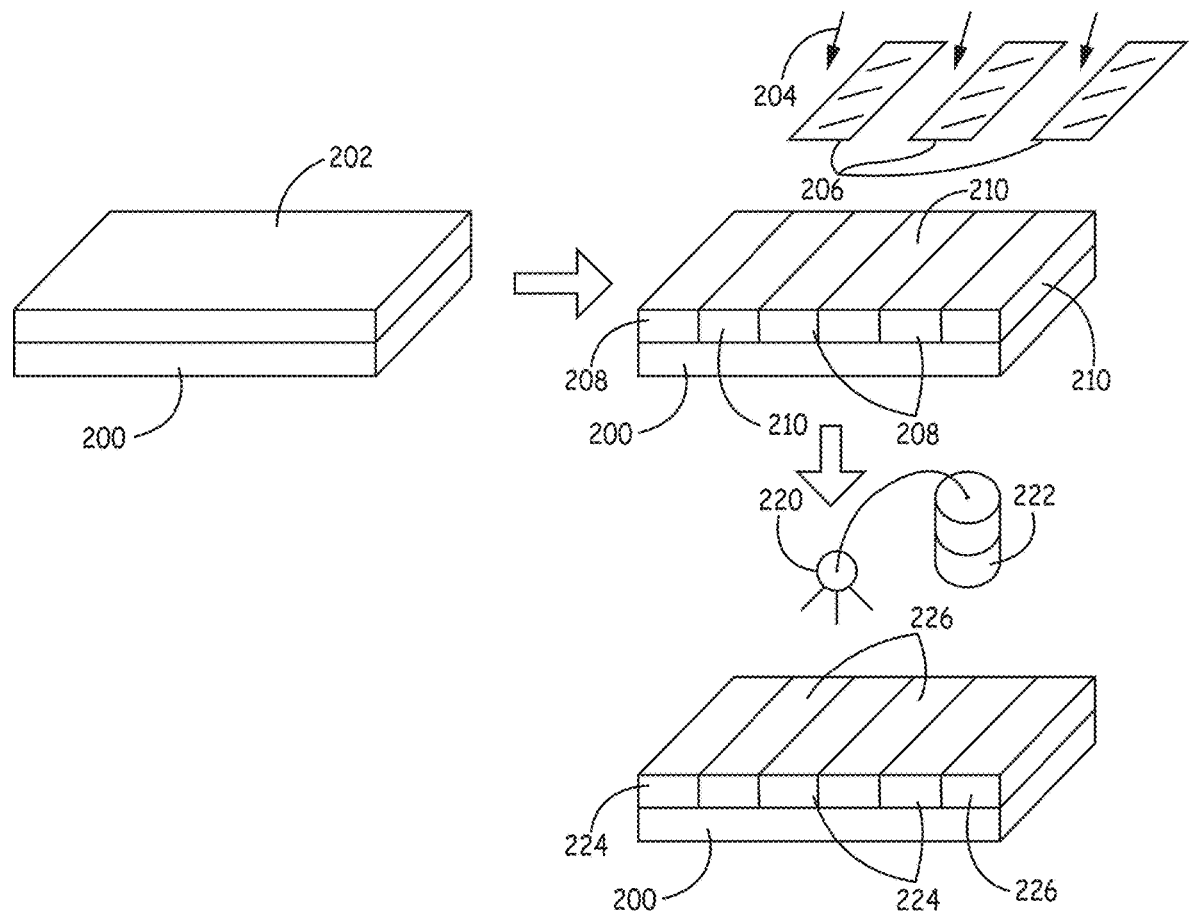
FIG. 6 is a schematic diagram showing processing steps for patterning a metal nanowire film based on patterned radiation curing of the film and subsequent application of a fusing solution to transform the cured polymer pattern into corresponding pattern of electrically conductive and electrically resistive regions.

In a third patterning approach, it has been discovered that with appropriately selected curable binders, crosslinking of the binders can inhibit fusing of the metal nanowires while the presence of the uncrosslinked binder does not prevent nanowire fusing. Thus, the patterning can be performed with appropriate patterning of the crosslinking. The crosslinking can be induced, for example, by radiation, such as ultraviolet radiation, electron beam radiation, or heat provided with infrared radiation. The patterning can be performed with a radiation mask to block the radiation over selected regions or by scanning the radiation across the surface to selectively crosslink the binder. The process is shown schematically in FIG. 6. In a first view, a substrate 200 is shown with a metal nanowire coating or film 202. In a second view, radiation 204 is patterned with a mask 206 to form crosslinked film 208 separated by regions of uncrosslinked film 210. In the third sequential view, fusing solution is deposited using an appropriately selected coating apparatus 220 from a reservoir of fusing solution 222 to form patterns of unfused and crosslinked regions 224 separated by regions of fused and uncrosslinked regions 226. Following completion of the fusing process, the film can be further crosslinked through the further irradiation across the whole surface or through suitable gentle heating, such as heating to 100° C. for 20 seconds to 30 minutes.

In some embodiments, the metal nanostructured films can be used as a replacement for other materials, such as thin films of conductive metal oxides, such as indium tin oxide. For example, a roll of polymer with fused metal nanostructured films can be incorporated into a process scheme. A polymer overcoat can be placed down prior to patterning. Patterning, such as with laser etching or masking with wet or dry etching, can be used to form desired patterns of electrically conductive films separated by regions where at least some of the metal is removed. The polymer overcoat can be replaced or completed. Metal traces or current collectors can be placed over the overcoat. Adding some conductive diluents to the polymer overcoat can decrease the resistance of the overcoat without short circuiting the conductive pattern.

The patterning options based on the use of fused metal nanostructured networks suggest alternative process flow. In the alternative process flow, patterning is performed prior to placement of a polymer overcoat. In principle, this process order can be performed with any of the patterning approaches described above, but for convenience, this process flow is described in the context of a patterned layer with electrically insulating regions of unfused metal nanowires and electrically conductive regions with fused metal nanostructured networks. As noted above, this type of patterning can be performed by patterning the delivery of a fusing agent and/or by patterning the crosslinking of a polymer binder in the film with metal nanowires.

Figure 7:
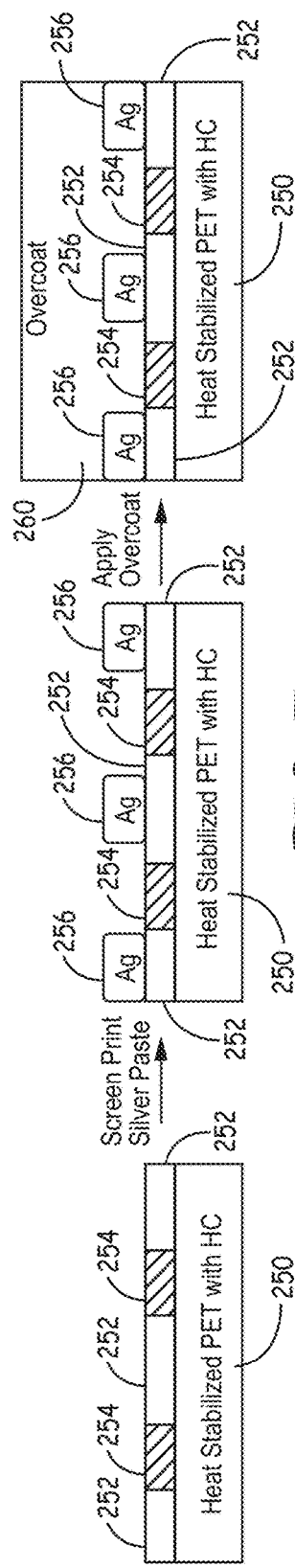
FIG. 7 is a schematic diagram showing the process flow for placement of conductive metal traces in contact with a patterned film and the deposition of a polymer overcoat over the metal traces and patterned film.

Referring to FIG. 7, a process flow is depicted with flow arrows indicating a process flow, which generally corresponds with a temporal flow but may or may not correspond with physical movement. In the first view, a substrate 250 is shown with a patterned film with conductive regions 252 and nonconductive regions 254. While the figure indicates a particular substrate material, i.e., heat stabilized PET polymer with an additional polymer hardcoat layer, the process can generally be performed with any reasonable substrate. In some embodiments, conductive regions 252 comprise fused metal nanostructured networks and the nonconductive regions 254 comprise unfused metal nanowires. Referring to the middle view of FIG. 7, metal current collectors or traces 256 are deposited in contact with conductive regions 252. While metal traces 256 can be deposited and/or patterned using any reasonable process, in some embodiments, a conductive silver or copper paste can be screen printed and heated to form the metal traces. In some embodiments, silver, copper or other metallic traces can be deposited by plating, thermal decomposition, evaporation, sputtering, or other reasonable thin film deposition techniques. In the last view of FIG. 7, a polymer overcoat 260 is placed over the coated substrate 250 to cover metal traces 256.

Touch Sensors

Figure 8:
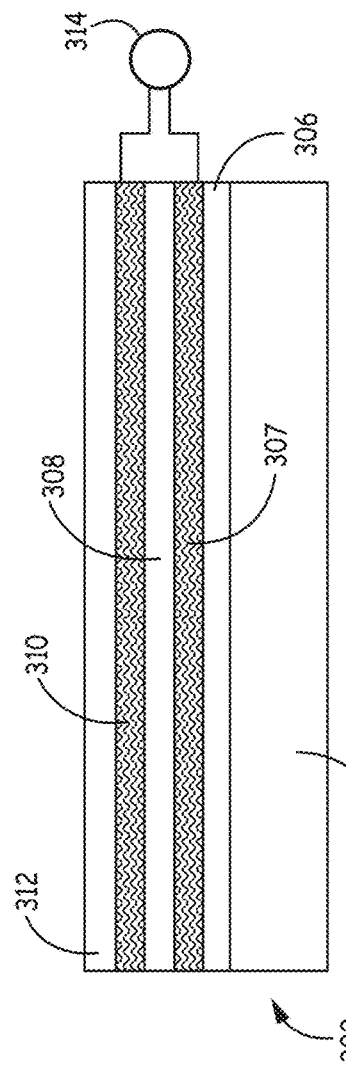
FIG. 8 is a schematic diagram showing a capacitance based touch sensor.
Figure 9:
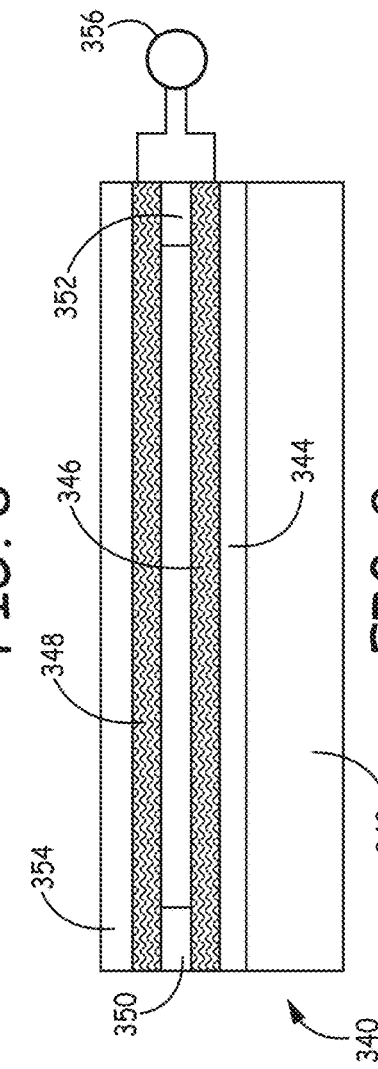
FIG. 9 is a schematic diagram showing a resistance based touch sensor.

The transparent conductive films described herein can be effectively incorporated into touch sensors that can be adapted for touch screens used for many electronic devices. Some representative embodiments are generally described here, but the transparent conductive films can be adapted for other desired designs. A common feature of the touch sensors generally is the presence of two transparent conductive electrode structures in a spaced apart configuration in a natural state, i.e., when not being touched or otherwise externally contacted. For sensors operating on capacitance, a dielectric layer is generally between the two electrode structures. Referring to FIG. 8, a representative capacitance based touch sensor 302 comprises a display component 304, an optional bottom substrate 306, a first transparent conductive electrode structure 307, a dielectric layer 308, such as a polymer or glass sheet, a second transparent conductive electrode structure 310, optional top cover 312, and measurement circuit 314 that measures capacitance changes associated with touching of the sensor. Referring to FIG. 9, a representative resistance based touch sensor 340 comprises a display component 342, an optional lower substrate 344, a first transparent conductive electrode structure 346, a second transparent conductive electrode structure 348, support structures 350, 352 that support the spaced apart configuration of the electrode structures in their natural configuration, upper cover layer 354 and resistance measuring circuit 356.

Display components 304, 342 can be, for example, LED based displays, LCD displays or other desired display components. Substrates 306, 344 and cover layers 312, 354 can be independently transparent polymer sheets or other transparent sheets. Support structures can be formed from a dielectric material, and the sensor structures can comprise additional supports to provide a desired stable device. Measurement circuits 314, 356 are known in the art. Transparent conductive electrodes 306, 310, 346 and 348 can be effectively formed using fused metal networks, which can be patterned appropriately to form distinct sensors, although in some embodiments the fused metal networks form some transparent electrode structures while other transparent electrode structures in the device can comprise materials such as indium tin oxide, aluminum doped zinc oxide or the like. Fused metal networks can be effectively patterned as described herein, and it can be desirable for patterned films in one or more of the electrode structures to form the sensors such that the plurality of electrodes in a transparent conductive structure can be used to provide position information related to the touching process. The use of patterned transparent conductive electrodes for the formation of patterned touch sensors is described, for example, in U.S. Pat. No. 8,031,180 to Miyamoto et al., entitled "Touch Sensor, Display With Touch Sensor, and Method for Generating Position Data," and published U.S. patent application 2012/0073947 to Sakata et al., entitled "Narrow Frame Touch Input Sheet, Manufacturing Method of Same, and Conductive Sheet Used in Narrow Frame Touch Input Sheet," both of which are incorporated herein by reference.

EXAMPLES

Commercial silver nanowires were used in the following examples with an average diameter of between 25 and 50 nm and an average length of 10-30 microns. The silver nanowires (AgNWs) films were formed using the following procedure. Commercially available silver nanowires (AgNWs) were dispersed in solvent to form an AgNW dispersion. The AgNWs dispersions were typically in the 0.1-1.0 wt % range in an alcohol solvent. The dispersion was then deposited on glass or polyethylene terephthalate (PET) surfaces as an AgNWs film using a spray coating or a hand-drawn rod approach or by blade coating. The AgNWs film was then processed further with a selected fusing agent to form fused metal nanostructured networks.

Fusing was carried out with either HCl vapor or a fusing solution. With HCl vapor, concentrated acid solutions were used as a source of HCl vapor. The HCl vapor was applied to AgNWs films by exposing the coated film to the vapor for a few seconds. When fusing with a fusing solution, the films were washed or blade treated with $AgNO_3$ (or AgF) in $HNO_3$ and ethanol, with a concentration of $Ag^+$ at about 0.001 mM to 50 mM and that of $HNO_3$ at about 0.001 mM to 50 mM, respectively.

Figure 13:
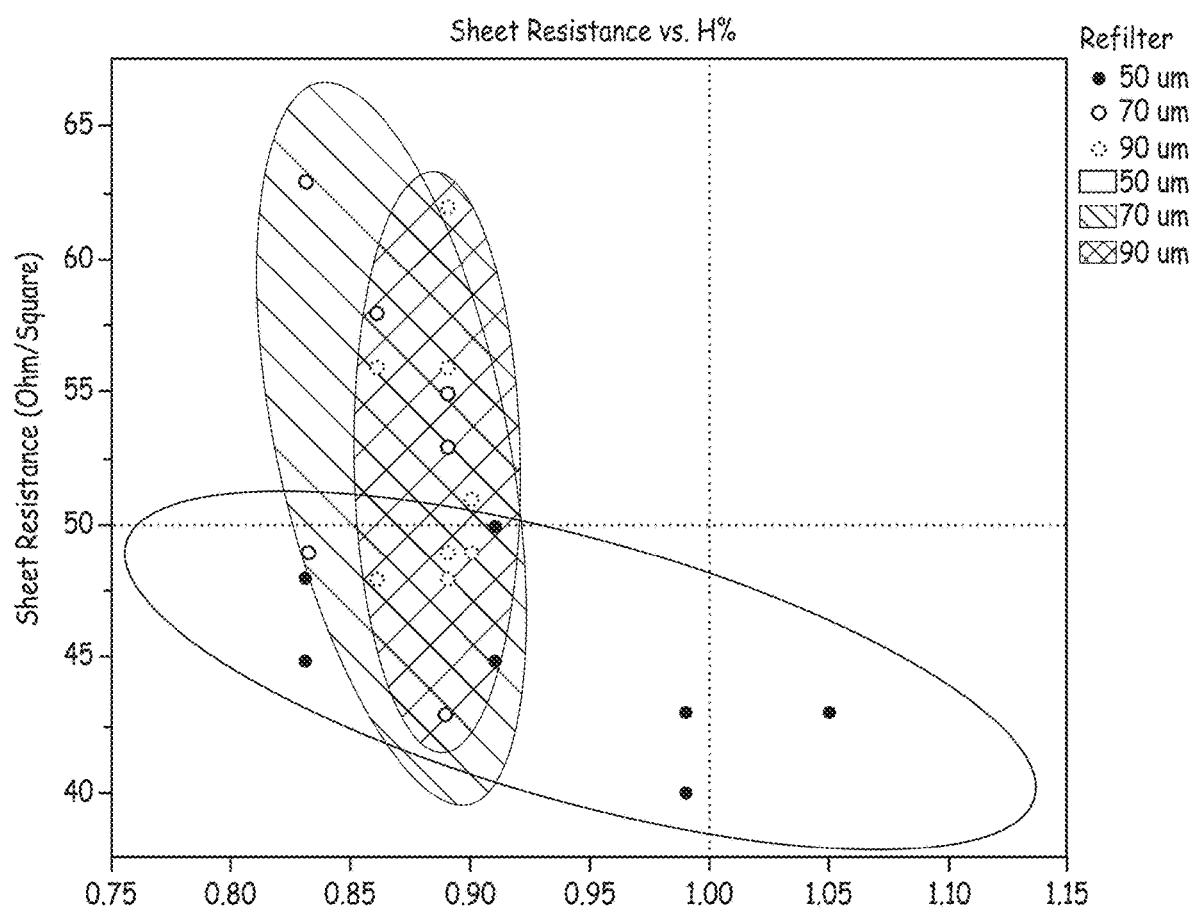
FIG. 13 is a graph of a comparison of sheet resistance and haze value for representative average film values.

The total transmission (TT) and haze of the AgNWs film samples were measured using a Haze Meter with films on a polymer substrate. To adjust the haze measurements for the samples below, a value of substrate haze can be subtracted from the measurements to get approximate haze measurements for the transparent conductive films alone. The instrument is designed to evaluate optical properties based on ASTM D 1003 standard ("Standard Test Method for Haze and Luminous Transmittance of Transparent Plastics"), incorporated herein by reference. The total transmission and haze of these films include PET substrate which has base total transmission and haze of ~92.9% and 0.1%-0.4%, respectively. Sheet resistance was measured with a 4-point probe method unless indicated otherwise. In the following examples, several different solution fusing agents are presented. The transparent conductor properties before and after fusing (especially) and the sheet resistance of the films are provided. A comparison of the sheet resistance and haze values for representative average film values are shown in FIG. 13. The network of nanowires can be composed of silver and some polymers which may serve as an ink dispersant or binder. Representative high resistance measurements were performed on the unfused metal nanowire films formed for these examples. To make the measurements, a square of silver paste was painted onto the surface of the samples to define a square, which were then annealed at roughly 120° C. for 20 minutes in order to cure and dry the silver paste. Alligator clips were connected to the silver paste, and the leads were connected to a commercial high resistance measurement device.

Example 1

Deionized Water as Solvent for AgNW Ink

This example tests the ability of deionized water to act as a solvent for AgNW inks.

AgNWs inks were created in deionized water. The inks contained a binder of ELVACITE® 2669 (Lucite International) in a concentration of 0.4-0.7 wt % or SANCURE® 843 (Lubrizol) in a concentration of 0.4-0.6 wt %. Wetting agents and thickeners were added to some samples each in a concentration of 0.1-0.45 wt %. The AgNW inks have roughly 0.2 wt % silver nanowires. The inks were then coated on a PET substrate using a Meyer rod or blade coating. The films were quickly dried with a heat gun or IR lamp for a few seconds to flash off solvents without significantly altering the metal nanowires.

The films were then treated with a fusing process, either HCl vapor or a fusing solution of $AgNO_3$ or AgF in $HNO_3$ and ethanol as described above. The properties of the films before and after the fusing agent application are compared in Table 1. Films treated with the fusing agents all showed significantly reduced resistance, indicating fusing or fusing has occurred in these film samples.

TABLE 1

| Binder | Fusing Agent | Resistance As Coated ($\Omega/\square$) | Resistance after Fusing ($\Omega/\square$) |
| --- | --- | --- | --- |
| Elvacite 2669 | HCl (vapor) | >20,000 | ~350 |
| Elvacite 2669 | HCl (vapor) | >2,620 | ~120 |

TABLE 1-continued

| Binder | Fusing Agent | Resistance As Coated ($\Omega/\square$) | Resistance after Fusing ($\Omega/\square$) |
|---|---|---|---|
| Elvacite 2669 | AgNO$_3$, HNO$_3$ | 1,520 | 431 |
| Sancure 843 | HCl (vapor) | 149,000 | ~180 |
| Sancure 843 | HCl (vapor) | 29,110 | 226 |
| Sancure 843 | AgF, HNO$_3$ | 12,360 | 262 |
| Sancure 843 | AgF, HNO$_3$ | 3,420 | 125 |
| Sancure 843 | HCl (vapor) | >20,000 | 399 |
| Sancure 843 | HNO$_3$ | 1,903,000 | 532 |
| Sancure 843 | AgNO$_3$, HNO$_3$ | 39,200,000 | 127 |
| Sancure 843 | AgNO$_3$, HNO$_3$ | >39,200,000 | 122 |

Overall, the vapor fusing results and the solution fusing results are qualitatively similar.

Example 2

Effect of Binders in Deionized Water and Organic Solvent AgNW Ink

This example tests the use of different polymer binders added to the AgNW Ink with a mixture of deionized water and organic solvents as the solvent.

AgNWs inks were created in a mixture of deionized water and ethanol, butyl cellosolve (BC), or propylene glycol monomethyl ether (PGME). The inks comprised a range of 0.3 to 1.5 weight percent of a binder of CARBOSET® 517H, CARBOSET® CR 781, CARBOSET® PC-27 (acrylic resin), from Lubrizol, HYBRIDUR®-870, HYBRIDUR®-570 (PUD), from Air Products, JONCRYL® 1915, JONCRYL® 1919, JONCRYL® 95, JONCRYL® 1987, JONCRYL® 8383 (acrylic resin) from BASF, OTTOPOL K-633, OTTOPOL S-75, OTTOPOL 522 (acrylic resin), from Gellner Industrial, LLC, QW 200, QW 93, QW18-1 (PUD), SF 18 (PUD), from Henkel, R-162, R-170 (PUD), from Resinate Materials Group, Inc., SANCURE® 815, SANCURE® 843, SANCURE® 843C, SANCURE® 878, SANCURE® 898, SANCURE® OM-933, from Lubrizol, BAYHYDROL® U XP 2239 (PUD), BAYHYDROL® UH 2952 (PUD), from Bayer MaterialScience, or NEOCRYL® XK-98 from DSM NeoResins, Inc. Epoxy functionalized silane oligomer (EFSO), or non-ionic surfactant (NIS) was added to some samples in concentrations from about 0.05 to about 0.2 wt % as a wetting agent. Modified urea (MU) in a concentration of 0.2-0.45 wt %, acrylic thickener (AT) in a concentration of 0.2-0.45 wt %, or polyacrylamide (PAM) in a concentration of 0.1 wt % was added to some samples as a thickener. Some samples included a polymeric dispersant in a concentration from about 0.02 wt % to about 0.05 wt %. The compositions of the AgNW inks are listed in Table 2 below. The inks were then coated using a Meyer rod or blade coating. The films were quickly dried with a heat gun or IR lamp for a few seconds to flash off solvents.

The films were then treated with a fusing solution of AgNO$_3$ in HNO$_3$ and ethanol as described above. The properties of the films before and after the fusing agent application are compared in Table 2.

TABLE 2

| Organic Solvent | Solvent to Water Ratio | Binder | Binder wt (%) | Wetting Agent | Thickener | Dispersant | AgNW approx wt % | Resistance As Coated ($\Omega/\square$) | Resistance after Fusing ($\Omega/\square$) | TT (%) | Haze (%) |
|---|---|---|---|---|---|---|---|---|---|---|---|
| Ethanol | 1:4 | Carboset 517H | 0.6 | EFSO | — | — | 0.163 | >20,000 | ~250 | | |
| Ethanol | 1:4 | Carboset CR781 | 0.6 | EFSO | MU | — | 0.163 | >20,000 | ~105 | | |
| Ethanol | 1:4 | Carboset CR781 | 0.6 | EFSO | — | — | 0.163 | >20,000 | ~160 | | |
| Ethanol | 1:4 | Carboset PC-27 | 0.6 | EFSO | — | — | 0.163 | >20,000 | ~125 | | |
| Ethanol | 1:4 | Hybridur-570 | 0.6 | EFSO | MU | — | 0.163 | >20,000 | ~110 | | |
| Ethanol | 1:4 | Hybridur-870 | 0.6 | EFSO | MU | — | 0.163 | >20,000 | ~90 | | |
| Ethanol | 1:4 | Hybridur-878 | 0.6 | EFSO | MU | — | 0.163 | >20,000 | ~87 | | |
| Ethanol | 1:4 | Joncryl 1915 | 0.6 | EFSO | — | — | 0.218 | >20,000 | ~210 | | |
| Ethanol | 1:4 | Joncryl 1919 | 0.6 | EFSO | — | — | 0.218 | >20,000 | ~180 | | |
| Ethanol | 1:4 | Joncryl 95 | 0.6 | EFSO | — | — | 0.218 | >20,000 | ~200 | | |
| Ethanol | 1:4 | Ottopol 522 | 0.6 | EFSO | — | — | 0.218 | >20,000 | ~150 | | |
| Ethanol | 1:4 | Ottopol K-633 | 0.6 | EFSO | — | — | 0.218 | >20,000 | ~140 | | |
| Ethanol | 1:4 | Ottopol S-75 | 0.6 | EFSO | — | — | 0.218 | >1,017 | ~130 | | |
| Ethanol | 1:4 | QW 200 | 0.6 | EFSO | MU | — | 0.163 | >20,000 | ~75 | | |
| Ethanol | 1:4 | QW 93 | 0.6 | EFSO | MU | — | 0.163 | >20,000 | ~83 | | |
| Ethanol | 1:4 | QW 18-1 | 0.6 | EFSO | MU | — | 0.163 | >20,000 | ~88 | | |
| Ethanol | 1:4 | R-162 | 0.6 | EFSO | MU | — | 0.163 | >20,000 | ~72 | | |
| Ethanol | 1:4 | R-170 | 0.6 | EFSO | MU | — | 0.163 | >20,000 | ~73 | | |
| Ethanol | 1:4 | Sancure 815 | 0.6 | EFSO | — | — | 0.163 | >20,000 | ~84 | | |
| Ethanol | 1:4 | Sancure 843 | 0.6 | EFSO | MU | — | 0.163 | >20,000 | ~75 | | |
| Ethanol | 1:4 | Sancure 843 | 0.6 | EFSO | MU | — | 0.163 | >20,000 | ~70 | | |

TABLE 2-continued

| Organic Solvent | Solvent to Water Ratio | Binder | Binder wt (%) | Wetting Agent | Thickener | Dispersant | AgNW approx wt % | Resistance As Coated (Ω/□) | Resistance after Fusing (Ω/□) | TT (%) | Haze (%) |
|---|---|---|---|---|---|---|---|---|---|---|---|
| Ethanol | 1:4 | Sancure 843 | 0.6 | EFSO | MU | — | 0.163 | >20,000 | ~90 | | |
| Ethanol | 1:4 | Sancure 843 | 0.6 | EFSO | — | — | 0.163 | >20,000 | ~105 | | |
| Ethanol | 1:4 | Sancure 843 | 0.6 | EFSO | — | — | 0.183 | >20,000 | ~100 | | |
| Ethanol | 1:4 | Sancure 843 | 0.6 | EFSO | — | — | 0.197 | >20,000 | ~68 | | |
| Ethanol | 1:4 | Sancure 843 | 0.6 | EFSO | — | — | 0.213 | >20,000 | ~66 | | |
| Ethanol | 1:4 | Sancure 843 | 0.6 | EFSO | — | — | 0.218 | >20,000 | ~147 | | |
| Ethanol | 1:4 | Sancure 843 | 0.6 | EFSO | — | — | 0.218 | >20,000 | ~142 | | |
| Ethanol | 1:4 | Sancure 843 | 0.6 | EFSO | — | — | 0.218 | >20,000 | ~120 | | |
| Ethanol | 1:4 | Sancure 843 | 0.6 | EFSO | AT | — | 0.163 | >20,000 | ~90 | | |
| Ethanol | 1:4 | Sancure 843 | 0.4 | NIS | — | — | 0.218 | >20,000 | ~75 | | |
| Ethanol | 1:4 | Sancure 843 | 0.6 | NIS | — | — | 0.218 | >20,000 | ~90 | | |
| Ethanol | 1:4 | Sancure 843 | 0.8 | NIS | — | — | 0.218 | >20,000 | ~110 | | |
| Ethanol | 1:4 | Sancure 843 | 1.0 | NIS | — | — | 0.218 | >20,000 | ~125 | | |
| Ethanol | 1:4 | Sancure 843 | 2.0 | NIS | — | — | 0.218 | >20,000 | ~1,000 | | |
| Ethanol | 1:4 | Sancure 843C | 0.6 | EFSO | MU | — | 0.163 | >20,000 | ~73 | | |
| Ethanol | 1:4 | Sancure 843C | 0.6 | EFSO | PAM | — | 0.163 | >20,000 | ~65 | | |
| Ethanol | 1:4 | Sancure 878 | 0.6 | EFSO | MU | — | 0.163 | >20,000 | ~220 | | |
| Ethanol | 1:4 | Sancure 898 | 0.6 | EFSO | — | — | 0.163 | >817 | ~120 | | |
| Ethanol | 1:4 | Sancure OM-933 | 0.6 | EFSO | — | — | 0.163 | >20,000 | ~75 | | |
| Ethanol | 1:4 | SF 18 | 0.6 | EFSO | MU | — | 0.163 | >20,000 | ~87 | | |
| Ethanol | 1:4 | U XP 2239 | 0.6 | EFSO | MU | — | 0.163 | >20,000 | ~88 | | |
| Ethanol | 1:4 | UH 2952 | 0.6 | EFSO | MU | — | 0.163 | >20,000 | ~95 | | |
| Ethanol | 1:4 | XP 2637 | 0.6 | EFSO | MU | — | 0.163 | >20,000 | ~98 | | |
| Butyl Cellosolve | 1:19 | Neocryl XK-98 | 0.5 | NIS | MU | — | 0.111 | >20,000 | 113 | | |
| Butyl Cellosolve | 1:19 | Neocryl XK-98/x | 0.5 | NIS | MU | — | 0.111 | >20,000 | 67 | | |
| PGME | 1:19 | Neocryl XK-98 | 1.5 | EFSO | MU | — | 0.118 | >20,000 | 48 | — | — |
| PGME | 1:19 | Neocryl XK-98 | 0.5 | EFSO | MU | — | 0.118 | >20,000 | 56 | — | — |
| POME | 1:9 | Neocryl XK-98 | 0.5 | EFSO | MU | — | 0.118 | >20,000 | 84 | — | — |
| PGME | 1:9 | Neocryl XK-98/x | 0.5 | EFSO | MU | — | 0.118 | >20,000 | 59 | — | — |
| PGME | 3:17 | Neocryl XK-98 | 0.5 | EFSO | MU | — | 0.118 | >20,000 | 77 | — | — |
| POME | 3:17 | Neocryl XK-98/x | 0.5 | EFSO | MU | — | 0.118 | >20,000 | 77 | — | — |
| POME | 3:17 | Neocryl XK-98 | 0.5 | NIS | MU | — | 0.10 | >20,000 | 110 | 92.1 | 1.96 |
| PGME | 3:17 | Neocryl XK-98/x | 0.5 | NIS | MU | — | 0.10 | >20,000 | 75 | 92.1 | 1.63 |
| PGME | 1:4 | Joncryl 1987 | 0.5 | NIS | MU | — | 0.10 | >20,000 | 140 | 92 | 1.89 |
| PGME | 1:4 | Joncryl 1987 | 0.5 | NIS | MU | — | 0.10 | >20,000 | 220 | 91.8 | 2.13 |
| PGME | 1:4 | Joncryl 8383 | 0.5 | NIS | MU | — | 0.10 | >20,000 | 117 | 91.8 | 1.81 |
| PGME | 1:4 | Joncryl 8383/x | 0.5 | NIS | MU | — | 0.10 | >20,000 | 129 | 92 | 1.83 |
| PGME | 1:4 | Neocryl XK-98 | 0.5 | EFSO | MU | — | 0.118 | >20,000 | 70 | — | — |
| PGME | 1:4 | Neocryl XK-98 | 0.5 | EFSO | MU | — | 0.118 | >20,000 | 102 | — | — |

TABLE 2-continued

| Organic Solvent | Solvent to Water Ratio | Binder | Binder wt (%) | Wetting Agent | Thickener | Dispersant | AgNW approx wt % | Resistance As Coated (Ω/□) | Resistance after Fusing (Ω/□) | TT (%) | Haze (%) |
|---|---|---|---|---|---|---|---|---|---|---|---|
| PGME | 1:4 | Neocryl XK-98 | 0.5 | NIS | MU | | 0.10 | >20,000 | 74 | 91.9 | 1.93 |
| PGME | 1:4 | Neocryl XK-98/x | 0.5 | NIS | MU | | 0.10 | >20,000 | 154 | 92.2 | 1.92 |
| PGME, BC | 1:1:8 | Neocryl XK-98 | 0.5 | NIS | MU | — | 0.143 | >20,000 | 111 | 91.4 | 2.61 |
| PGME, BC | 1:1:8 | Neocryl XK-98 | 0.7 | NIS | MU | — | 0.143 | >20,000 | 84 | 91.3 | 3.93 |
| PGME, BC | 1:1:8 | Neocryl XK-98 | 0.9 | NIS | MU | — | 0.143 | >20,000 | 89 | 91.6 | 1.7 |
| PGME, BC | 1:1:8 | Neocryl XK-98 | 0.9 | EFSO | MU | #1 0.022% | 0.111 | >20,000 | 64 | 90.8 | 5.5 |
| PGME, BC | 1:1:8 | Neocryl XK-98 | 0.9 | EFSO | MU | #1 0.022% | 0.111 | >20,000 | 69 | 91 | 4.3 |
| PGME, BC | 1:1:8 | Neocryl XK-98 | 0.9 | EFSO | MU | #2 0.022% | 0.111 | >20,000 | 69 | 90.8 | 3.9 |
| PGME, BC | 1:1:8 | Neocryl XK-98 | 0.9 | EFSO | MU | #2 0.033% | 0.111 | >20,000 | 69 | 90.8 | 2.96 |
| PGME, BC | 1:1:8 | Neocryl XK-98 | 0.9 | EFSO | MU | #3 0.022% | 0.111 | >20,000 | 88 | 90.9 | 3.03 |
| PGME, BC | 1:1:8 | Neocryl XK-98 | 0.9 | EFSO | MU | #3 0.033% | 0.111 | >20,000 | 72 | 91.2 | 3.45 |

The sheet resistance results were roughly comparable with all of the polymer binders.

Example 3

Organic Solvents as an AgNW Solvent

This example tests the ability of organic solvents to act as a solvent for AgNW Ink.

AgNWs inks were created in solvent mixtures of methyl ethyl ketone (MEK), isobutanol (IBA), methyl isobutyl ketone (MIBK), tert-butyl alcohol (TBA), propylene glycol monomethyl ether (PGME), propylene glycol monomethyl ether acetate (PGMEA), n-butyl acetate (BA), ethyl acetate (EA), ethanol (EtOH), ethyl lactate (ELA), or butyl cellosolve (BC), or in a mixture of toluene/methanol/cyclopentanone (TMC). The inks contained a binder of CAB 171-15 from Eastman Chemical, ethyl cellulose (EC), polyvinylacetate (PVAc) from Sigma-Aldrich, ELVACITE® 2041, ELVACITE® 2010, ELVACITE® 2042, ELVACITE® 2045, ELVACITE® 2669 from Lucite International, NEOCRYL® XK-98 from DSM NeoResins, JONCRYL® 611, JONCRYL® 690 from BASF, MOWITOL® B60HH (poly(vinyl butyral)), from Kuraray American Inc. Some samples included a crosslinker (Crosslinker CX-100 from DSM NeoResins) in a concentration of 1% to 3% by weight relative to the polymer binder. Some samples included a surfactant as a wetting agent in a concentration of 0.1% by weight. Some samples included a thickener in a concentration of 0.4% to 0.5% by weight. Some samples included a polymeric dispersant in a concentration from about 0.02 wt % to about 0.05 wt %. The compositions of the AgNW inks are listed in Table 3 below. The inks were then coated using a Meyer rod or blade coating. The films were quickly dried with a heat gun or IR lamp for a few seconds to flash off solvents.

The films were then treated with a fusing process, either HCl vapor or a fusing solution of AgNO$_3$ or AgF in HNO$_3$ and ethanol, as described above, by washing or blade coating (B). The properties of the films before and after the fusing agent application are compared in Table 3.

TABLE 3

| Solvents | Solvent Ratio | Binder | Binder wt (%) | Crosslinker | Fusing Agent | AgNW Approx wt % | Resistance As Coated (Ω/□) | Resistance after Fusing (Ω/□) | TT (%) | Haze (%) |
|---|---|---|---|---|---|---|---|---|---|---|
| TMC | — | EC | 1.1 | No | HCl (Vapor) | 0.143 | >20,000 | ~100 | 89.5 | 2.46 |
| TMC | — | EC | 1.7 | No | HCl (Vapor) | 0.143 | >20,000 | ~460 | 91.1 | 1.94 |
| TMC | — | PVAc | 1.1 | No | HCl (Vapor) | 0.143 | >20,000 | ~185 | 91.6 | 2.98 |
| MEK, IBA, ELA | 2:3:5 | CAB 171-15 | 0.8 | No | HCl (Vapor) | 0.2 | 14,850 | 1364 | | |
| MEK, IBA, ELA | 2:3:5 | CAB 171-15 | 0.8 | No | AgNO$_3$, HNO$_3$ | 0.2 | 8,520 | 365 | | |
| MEK, IBA, ELA | 2:3:5 | Elvacite 2041 | 0.4 | No | AgNO$_3$, HNO$_3$ | 0.17 | >20,000 | ~88 | | |
| MEK, IBA | 1:1 | Elvacite 2041 | 1.2 | No | AgNO$_3$, HNO$_3$ | 0.2 | ~1,200 | ~200 | | |
| MIBK, TBA, PGMEA | 4:3:3 | Elvacite 2010 | 0.4 | No | AgNO$_3$, HNO$_3$ | 0.17 | ~2,000 | ~90 | | |

TABLE 3-continued

| Solvents | Solvent Ratio | Binder | Binder wt (%) | Cross-linker | Fusing Agent | AgNW Approx wt % | Resistance As Coated ($\Omega/\square$) | Resistance after Fusing ($\Omega/\square$) | TT (%) | Haze (%) |
|---|---|---|---|---|---|---|---|---|---|---|
| MIBK, TBA, PGMEA | 4:3:3 | Elvacite 2041 | 0.4 | No | $AgNO_3$, $HNO_3$ | 0.118 | >20,000 | ~88 | | |
| MIBK, TBA, PGMEA | 4:3:3 | Elvacite 2041 | 0.4 | No | $AgNO_3$, $HNO_3$ | 0.13 | >20,000 | ~170 | | |
| MIBK, TBA, PGMEA | 4:3:3 | Elvacite 2041 | 0.4 | No | $AgNO_3$, $HNO_3$ | 0.144 | >20,000 | ~110 | | |
| MIBK, TBA, PGMEA | 4:3:3 | Elvacite 2041 | 0.4 | No | $AgNO_3$, $HNO_3$ | 0.163 | >12,530 | ~78 | | |
| MIBK, TBA, PGMEA | 4:3:3 | Elvacite 2041 | 0.4 | No | $AgNO_3$, $HNO_3$ | 0.17 | >20,000 | ~120 | | |
| MIBK, TBA, PGMEA | 4:3:3 | Elvacite 2041 | 0.4 | No | $AgNO_3$, $HNO_3$ | 0.17 | >20,000 | ~90 | | |
| MIBK, TBA, PGMEA | 4:3:3 | Elvacite 2041 | 0.4 | No | $AgNO_3$, $HNO_3$ | 0.17 | ~2,500 | ~115 | | |
| MIBK, TBA, PGMEA | 4:3:3 | Elvacite 2041 | 0.4 | No | $AgNO_3$, $HNO_3$ | 0.17 | >3,900 | ~70 | | |
| MIBK, TBA, PGMEA | 4:3:3 | Elvacite 2041 | 0.4 | No | $AgNO_3$, $HNO_3$ | 0.17 | >20,000 | ~160 | | |
| MIBK, TBA, PGMEA | 4:3:3 | Elvacite 2041 | 0.4 | No | $AgNO_3$, $HNO_3$ | 0.177 | >10,850 | ~60 | | |
| MIBK, TBA, PGMEA | 4:3:3 | Elvacite 2041 | 0.4 | No | $AgNO_3$, $HNO_3$ | 0.189 | >754 | ~52 | | |
| MIBK, TBA, PGMEA | 4:3:3 | Elvacite 2041 | 0.4 | No | $AgNO_3$, $HNO_3$ | 0.203 | >598 | ~43 | | |
| MIBK, TBA, PGMEA | 4:3:3 | Elvacite 2041 | 0.4 | No | $AgNO_3$, $HNO_3$ | 0.217 | >1,130 | ~66 | | |
| MIBK, TBA, PGMEA | 4:3:3 | Elvacite 2041 | 0.4 | No | $AgNO_3$, $HNO_3$ | 0.218 | >260 | ~38 | | |
| MIBK, TBA, PGMEA | 4:3:3 | Elvacite 2042 | 0.4 | No | $AgNO_3$, $HNO_3$ | 0.17 | >20,000 | ~75 | | |
| MIBK, TBA, PGMEA | 4:3:3 | Elvacite 2045 | 0.4 | No | $AgNO_3$, $HNO_3$ | 0.17 | — | ~85 | | |
| MIBK, TBA, PGMEA | 4:3:3 | Elvacite 2045 | 0.4 | No | $AgNO_3$, $HNO_3$ | 0.17 | >20,000 | ~99 | | |
| BA, IBA | 1:1 | E2669 | 0.44 | Yes | $AgNO_3$, $HNO_3$ | 0.157 | >20,000 | 200 | 91.2 | 1.32 |
| BA, IBA | 1:1 | E2669 | 0.48 | Yes | $AgNO_3$, $HNO_3$ | 0.171 | >20,000 | 83 | 91.1 | 1.46 |
| BA, IBA | 1:1 | E2669 | 0.50 | Yes | $AgNO_3$, $HNO_3$ | 0.143 | >20,000 | 160 | 91.9 | 0.92 |
| BA, IBA | 1:1 | E2669 | 0.52 | Yes | $AgNO_3$, $HNO_3$ | 0.186 | >20,000 | 59 | 90.4 | 1.68 |
| BA, IBA | 1:1 | Joncryl 611 | 0.70 | No | $AgNO_3$, $HNO_3$ | 0.148 | >20,000 | 137 | 91.5 | 7.90 |
| BA, IBA | 1:1 | E2669 | 0.77 | Yes | $AgNO_3$, $HNO_3$ | 0.157 | >20,000 | 98 | 91.1 | 1.46 |
| BA, IBA | 1:1 | E2669 | 0.84 | Yes | $AgNO_3$, $HNO_3$ | 0.171 | >20,000 | 75 | 90.8 | 1.52 |
| BA, IBA | 1:1 | E2669 | 0.90 | Yes | $AgNO_3$, $HNO_3$ | 0.143 | >20,000 | 215 | 92.2 | 0.81 |
| BA, IBA | 1:1 | E2669 | 0.91 | Yes | $AgNO_3$, $HNO_3$ | 0.186 | >20,000 | 72 | 90.9 | 1.53 |
| BA, PGME | 11:8 | PVAc (100K) | 0.70 | No | HCl (vapor) | 0.171 | >20,000 | ~300 | 92.2 | 1.68 |
| BA, PGME | 3.4:5 | PVAc (100K) | 1.00 | No | HCl (vapor) | 0.171 | >20,000 | 273 | 92.6 | 1.41 |
| EA, EtOH | 4:6 | PVAc (100K) | 0.70 | No | HCl (vapor) | 0.143 | >20,000 | 120 | 92.1 | 1.19 |
| EA, EtOH | 4:6 | PVAc (100K) | 0.70 | No | AgF—EtOH/B | 0.143 | >20,000 | 154 | 91.7 | 1.77 |
| EA, EtOH | 4:6 | PVAc (100K) | 0.80 | No | HCl (vapor) | 0.143 | >20,000 | 137 | 91.8 | 1.38 |
| EA, EtOH | 4:6 | PVAc (100K) | 0.80 | No | AgF—EtOH/B | 0.143 | >20,000 | 287 | 92.0 | 1.38 |
| IBA, ELA, MEK | 2:3:3 | B60HH | 0.70 | No | $AgNO_3$, $HNO_3$ | 0.143 | >20,000 | 65 | 90.4 | 4.45 |

TABLE 3-continued

| Solvents | Solvent Ratio | Binder | Binder wt (%) | Cross-linker | Fusing Agent | AgNW Approx wt % | Resistance As Coated (Ω/□) | Resistance after Fusing (Ω/□) | TT (%) | Haze (%) |
|---|---|---|---|---|---|---|---|---|---|---|
| IBA, ELA, MEK | 2:3:3 | EC | 0.70 | No | HCl (vapor) | 0.143 | 1300-7000 | ~105 | 92.1 | 1.48 |
| MIBK, PGME | 1:1 | B60HH | 0.70 | No | HCl (vapor) | 0.143 | >20,000 | 208 | — | — |
| MIBK, PGME | 1:1 | E2669 | 0.70 | Yes | AgNO₃, HNO₃ | 0.125 | >20,000 | 94 | 92.1 | 0.67 |
| MIBK, PGME | 1:1 | E2669 | 0.70 | Yes | AgNO₃, HNO₃ | 0.143 | >20,000 | 84 | 92.2 | 1.11 |
| MIBK, PGME | 1:1 | E2669 | 0.70 | Yes | AgNO₃, HNO₃ | 0.167 | >20,000 | 77 | 91.3 | 0.86 |
| MIBK, PGME | 1:1 | E2669 | 0.93 | Yes | AgNO₃, HNO₃ | 0.190 | >20,000 | 18 | 87.7 | 3.31 |
| MIBK, PGME | 1:1 | E2669 | 0.93 | Yes | AgNO₃, HNO₃ | 0.190 | >20,000 | 45 | 90.5 | 1.52 |
| MIBK, PGME | 1:1 | E2669 | 0.70 | Yes | AgNO₃, HNO₃ | 0.222 | >20,000 | 196 | 91.8 | 0.67 |
| MIBK, PGME | 1:1 | E2669 | 0.70 | Yes | AgNO₃, HNO₃ | 0.250 | >20,000 | 143 | 91.8 | 0.86 |
| MIBK, PGME | 1:1 | E2669 | 0.70 | Yes | AgNO₃, HNO₃ | 0.286 | >20,000 | 96 | 92.0 | 0.81 |
| MIBK, PGME | 1:1 | E2669 | 0.70 | Yes | AgNO₃, HNO₃ | 0.300 | >20,000 | 61 | 90.8 | 1.61 |
| MIBK, PGME | 1:1 | E2669 | 0.93 | Yes | AgNO₃, HNO₃ | 0.300 | >20,000 | 25 | 88.7 | 2.91 |
| MIBK, PGME | 1:1 | E2669 | 0.70 | Yes | AgNO₃, HNO₃ | 0.333 | >20,000 | 69 | 90.8 | 1.17 |
| MIBK, PGME | 3:1 | E2669 | 0.70 | No | AgNO₃, HNO₃ | 0.143 | >20,000 | 71 | 91.7 | 1.47 |
| MIBK, PGME | 3:1 | E2669 | 0.70 | Yes | AgNO₃, HNO₃ | 0.143 | >20,000 | 76 | — | — |
| MIBK, PGME | 3:1 | E2669 | 0.70 | Yes | AgNO₃, HNO₃ | 0.143 | >20,000 | 120 | — | — |

Certain solvent combinations resulted in more consistent films having a high sheet resistance as deposited without fusing.

Example 4

Effect of Dispersant on Resistivity of Films Formed with n-Butyl Acetate and Isobutanol Solvent Based AgNW Ink This example tests the effect of dispersants on resistivity in n-butyl acetate and isobutanol solvent AgNW Ink.

AgNWs inks with an AgNW concentration of approximately 0.145% by weight were created in a mixture of n-butyl acetate and isobutanol (1:1 v/v). The inks contained a binder of ELVACITE® 2669 from Lucite International in a concentration of 0.70% by weight and a crosslinker (CX-100 from DSM NeoResins) in a concentration of 0.021% by weight. The inks also contained a polymeric dispersant or surfactant in a concentration 0.25% to 0.3% by weight. The compositions of the AgNW inks are listed in Table 4 below. The inks were then coated using a Meyer rod. The films were quickly dried with a heat gun or IR lamp for a few seconds to flash off solvents.

The films were then rinsed with a fusing solution containing AgNO₃ in HNO₃ and ethanol, as described above. The properties of the films before and after the fusing agent application are compared in Table 4.

TABLE 4

| Dispersant | Resistance As Coated (Ω/□) | Resistance after Fusing (Ω/□) | TT % | H % |
|---|---|---|---|---|
| Polymeric Dispersant 1 | >20,000 | 83 | | |
| Surfactant 1 | >20,000 | 106 | | |
| Polymeric Dispersant 2 | >20,000 | 95 | 91.4 | 1.22 |
| Polymeric Dispersant 3 | >20,000 | 93 | 90.9 | 1.12 |

The films generally had qualitatively similar properties.

Example 5

Effects of UV Induced Binder Crosslinking on AgNW Fusing

This example tests silver nanowire films with UV-Curable resins for patterning of silver nanowires.

UV-Curable resins were used at 0.60 wt % in AgNW inks as shown in Table 5. A photocrosslinker with a concentration of 1 wt % in H₂O/EtOH was introduced into the AgNW ink at different proportions. The coated film samples were cured using a UV conveyor system at ~100 mW/cm² and ~5 m/min. The films were then subject to a rinse with ethanol or an application of the fusing solution consisting of AgNO₃ in HNO₃ and ethanol as described above. The resistance, total transmission and haze values, including contributions from the PET, of the films were measured and the results listed in Table 5 below. As the curing increases the resistance dramatically increased. The sample that was passed three or more times under UV was out of range of the hand-held 4-point probe.

TABLE 5

| No. | Photocrosslinker solution in ink | UV cure (pass) | Total Trans. % | Haze % | Resistance After EtOH Wash (Ω/□) | Resistance after Fusing (Ω/□) |
|---|---|---|---|---|---|---|
| 1 | 70 μL/5 g ink | 3 | 91.6 | 0.86 | >20,000 | 1315, 1840, >20,000 |
| 2 | 70 μL/5 g ink | 3 | 91.5 | 0.93 | | >20,000, 5010, 3040 |
| 3 | 350 μL/5 g ink | 3 | 91.5 | 0.86 | >20,000 | >20,000 |
| 4 | 350 μL/5 g ink | 3 | 91.5 | 0.86 | | >20,000 |
| 5 | 700 μL/5 g ink | 3 | 92.0 | 1.05 | >20,000 | >20,000, 4370, 3320 |
| 6 | 700 μL/5 g ink | 3 | 91.4 | 1.00 | | >20,000 |
| 7 | 70 μL/5 g ink | 2 | 91.6 | 0.86 | 1840, 251, 2230 | |
| 8 | 70 μL/5 g ink | 2 | 91.4 | 0.94 | | 5360, 528, 215 |
| 9 | 225 μL/5 g ink | 1 | 91.4 | 0.97 | | 130, 90, 103 |
| 10 | 225 μL/5 g ink | 3 | 91.3 | 0.99 | | 674, 501, 723 |
| 11 | 225 μL/5 g ink | 5 | 91.3 | 0.91 | | >20,000 |

The results indicate that the curing of the films can inhibit fusing of the AgNW into a conductive film. Thus, the results suggest that patterning of the crosslinking can effectively pattern the fusing of the nanowires.

Example 6

Reinforced Base Coat for Selective Fusing

This example tests a UV cross-linkable material in the silver nanowire film for patterning of silver nanowire films.

California Hard Coat solution PermaNew 6000 (V2) (CHC), from California Hardcoating Company, was introduced into the AgNW inks as shown in Table 6. The ink contained AgNW at 0.165%, thickener at 0.45%, PU binder at 0.6%, and wetting agent at 0.1%, all by weight, in a water-alcohol mixture solvent. Certain regions or samples were cured using a UV conveyor system at ~100 mW/cm$^2$ and ~5 m/min. The films were then subject to an application of the fusing solution consisting of AgNO$_3$ in HNO$_3$ and ethanol, as described above. The resistance, total transmission and haze values, including contribution from the PET, of the films were measured and the results listed in Table 6 below. The optimized conditions in samples 5A and 5B show ~80 ohm/sq or ~65 ohm/sq in the non-cured area after the application of the fusing solution, as opposed to the out of range resistance in the cured (exposed) areas. At a lower concentration of CHC the fusing solution makes all areas conducting. At a moderate concentration of CHC the resistance in the cured areas is very high and <100 ohm/sq in the uncured areas. At a higher concentration of CHC, the resistance is very high despite the application of the fusing solution suggestive of interference with the fusing process.

TABLE 6

| No. | CHC in ink (wt %) | UV Conveyor Passes | Resistance Cured Area After Fusing Solution (Ω/□) | Resistance Uncured Area After Fusing Solution (Ω/□) |
|---|---|---|---|---|
| 1 | 0 | 4 | ~55 | 55 |
| 2 | 0.028 | 4 | 9,000 | N/A |
| 3 | 0.056 | 4 | 14,000 | N/A |
| 4 | 0.28 | 4 | >20,000 | N/A |
| 5A | 0.28 | 4 | >20,000 | 80 |
| 5B | 0.28 | 5 | >20,000 | 65 |
| 6 | 0.42 | 4 | >20,000 | N/A |
| 7 | 0.56 | 4 | >20,000 | N/A |
| 8 | 1.1 | 4 | >20,000 | N/A |
| 9 | 2.2 | 4 | >20,000 | N/A |

This example confirms the ability with appropriately formed films to pattern sheet resistance based on crosslinked patterning of the polymer binder.

Example 7

Patterning with UV Curable Ag Nanowire Inks

This example tests a UV cross-linkable material in the base coat for invisible patterning of silver nanowires.

UV Resins BAYHYDROL® UV 2689 (UV 2689), BAYHYDROL® UV 2317 (UV 2317) from Bayer Material Science, UCECOAT 7674® (UC 7674), UCECOAT® 7655 (UC 7655), UCECOAT® 7699 (UC 7699), and UCECOAT® 7890 (UC 7890) from Cytec, were introduced into the AgNW inks in a concentration of 0.30 wt %, along with a photocrosslinker (photo initiator) in a concentration of 0.015 wt % as shown in Table 7. The samples were then passed through a UV conveyor system at ~100 mW/cm$^2$ and ~5 m/min to crosslink the exposed areas. After UV curing, the films were then subject to an application of the fusing solution consisting of AgNO$_3$ in HNO$_3$ and ethanol, as described above. The resistance, total transmission and haze values, including contributions from the PET, of the patterned films were measured and the results listed in Table 7 below.

TABLE 7

| | | UV Irradiated | | | Covered | |
|---|---|---|---|---|---|---|
| | Resin | Resistance (Ω/□) | Total Trans. % | Haze % | Resistance (Ω/□) | Total Trans. % | Haze % |
| 1 | UV 2689 | >20,000 | 92.4 | 1.12 | 65-115 | 92.4 | 1.15 |
| 2 | UV 2317 | >20,000 | 92.4 | 1.14 | 70-100 | 92.4 | 1.21 |
| 3 | UC 7674 | >20,000 | 92.6 | 1.23 | 70-90 | 92.5 | 1.18 |
| 4 | UC 7655 | >20,000 | 92.4 | 1.08 | 75-100 | 92.3 | 1.19 |
| 5 | UC 7699 | >20,000 | 92.2 | 1.56 | 80-85 | 92.3 | 1.53 |
| 6 | UC 7890 | >20,000 | 92.4 | 1.17 | 90-75 | 92.3 | 1.28 |

Figure 10:
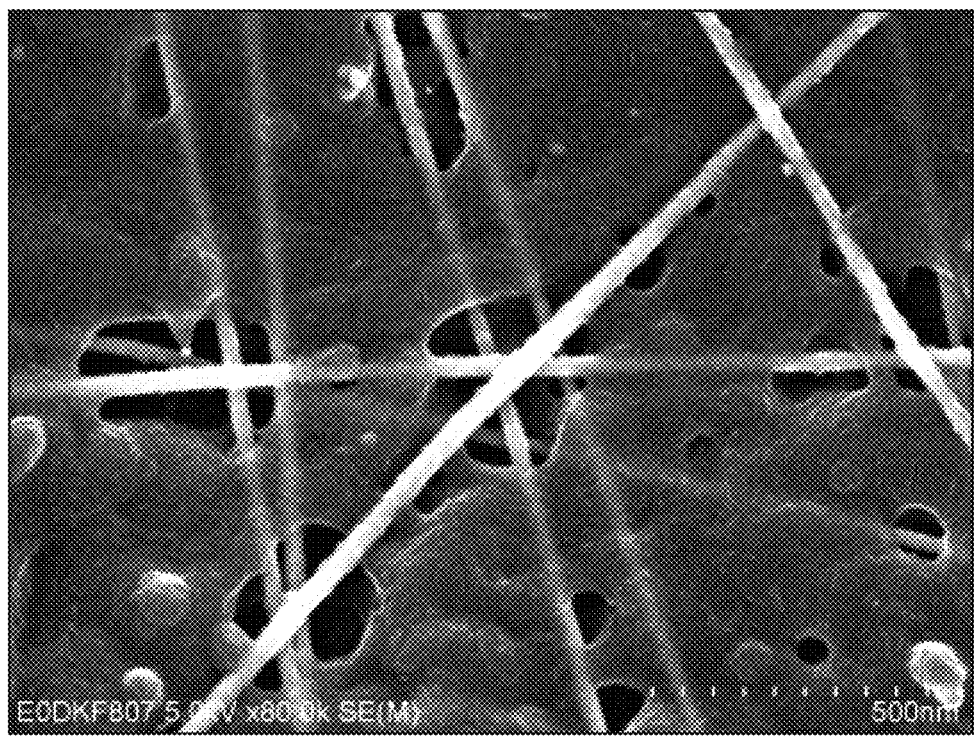
FIG. 10 is a scanning electron micrograph showing the surface of a silver nanowire film with a binder following application of a fusing solution.

A representative scanning electron micrograph of the film following application of the fusing solution and rinsing is presented in FIG. 10. Some removal of polymer binder can be observed along the film. It is not known if the binder removal is associated with the fusing of the nanowires, and/or with some observed visual differences between the fused and unfused sections of the film. However, as described in the following Example, application of a polymer overcoat can significantly decrease or eliminate visual differences between the unfused and fused sections of the film.

Example 8

Overcoat for Invisible Patterning

This example demonstrates the ability of an overcoat to reduce the visibility of a pattern in a selectively fused AgNW film.

Figure 11:
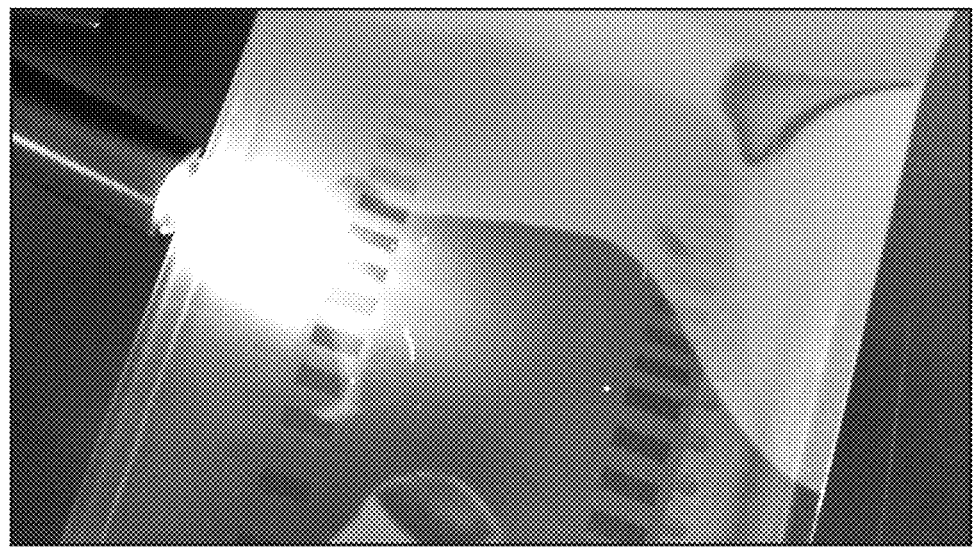
FIG. 11 is a photograph of a patterned film with series of fused metal nanostructured lines of about three inches in length and with varying widths along a substrate and with a polymer overcoat placed along a two inch wide stripe running through the lines of the fused metal nanostructured films to leave segments of each line uncovered at both ends of the lines.

The selectively fused AgNW films of Example 7 were coated with a UV curable polymer overcoat solution. In particular, the silver nanowires were fused along roughly three inch long lines with varying widths according to the method of Example 7. The coated samples were tested for total transmission and haze by the process described above. The polymer overcoat was placed along a two inch stripe down the middle of the patterned film leaving about a half inch of the fused conductive lines sticking out along each end of the overcoat. Referring to FIG. 11, a film on a polymer substrate is shown with an overcoat applied to a center stripe of the substrate surface. Patterned lines are visible on either side of the overcoat, but the patterning is essentially invisible at locations in which the overcoat is present. Thus, patterned samples coated with the polymer overcoat demonstrated a significantly reduced pattern visibility.

Figure 12:
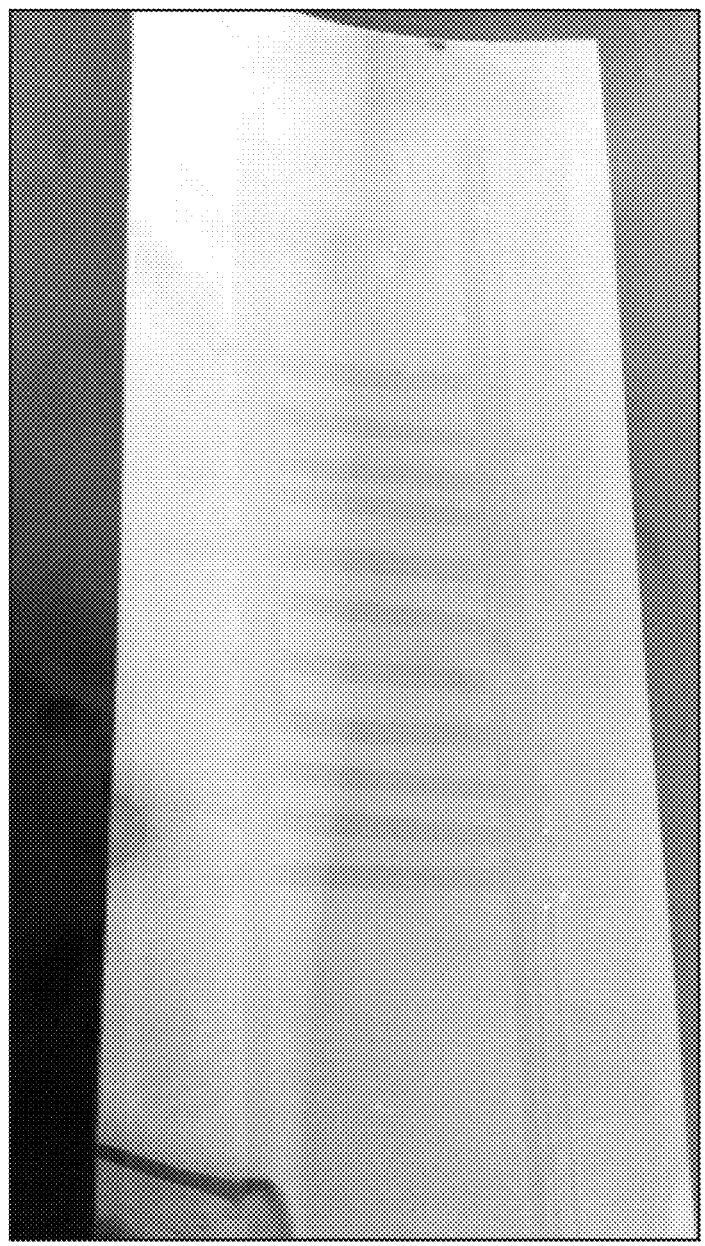
FIG. 12 is a photograph of a silver nanowire film that has been fused and etched to remove the fused metal nanostructured network except along a series of lines of about three inches long and then covered with a polymer overcoat.

For comparison, a silver nanowire ink was deposited onto a substrate and fused with a fusing solution. Then, the electrically conductive film was patterned with photolithography and etching to remove the fused metal nanostructured network except along a series of about three inch long lines. After etching and removal of the photoresist, the film was covered with the same polymer overcoat used to form the film shown in FIG. 11. Referring to FIG. 12, the pattern formed with etching is still visible following the application of the polymer overcoat, so a visible pattern of conductive and resistive sections formed with removal of metal does not seem to be made significantly less visible through the addition of a polymer overcoat.

Example 9

Basic Fusing Solution

This example demonstrates the ability of a basic fusing solution to fuse a AgNW film.

AgNWs inks were created in butyl acetate-isobutanol solvent mixture. The inks contained a binder of ELVACITE® 2669 from Lucite International in a concentration of 0.7 wt % and a crosslinker CX-100 from DSM NeoResins at 0.014 to 0.035 wt %. The inks were then coated using a Meyer rod or blade coating. The films were quickly dried with a heat gun or IR lamp for a few seconds to flash off solvents and heated at 65° C. for 1 min.

The films were then treated with a fusing process, one part of the film was subject to a 1 min treatment with a basic fusing solution (0.1 N NaOH in water) and the other part of the same coating was exposed to spray-washing with the acidic fusing solution of $AgNO_3$ in $HNO_3$ and ethanol, as described above. The properties of the films before and after the fusing agent application are compared in Table 8. Films treated with the fusing agents all showed significantly reduced resistance, indicating fusing or fusing has occurred in these film samples.

TABLE 8

| CX-100 | As coated Resistance (Ω/□) | Basic fusing Resistance (Ω/□) | Acidic fusing Resistance (Ω/□) | Base Fusing Total Trans. % | Base Fusing Haze % |
|---|---|---|---|---|---|
| 0.014% | >20,000 | ~2000 | 80 | 90.5 | 1.42 |
| 0.021% | >20,000 | ~500 | 80 | 90.8 | 1.39 |
| 0.028% | >20,000 | 60 | 50 | 89.3 | 2.29 |
| 0.035% | >20,000 | 50 | 50 | 89.3 | 2.24 |

This example confirms the ability of basic solutions as fusing agent to lower the sheet resistance of AgNW coatings containing a binder.

The embodiments above are intended to be illustrative and not limiting. Additional embodiments are within the claims. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A coated substrate comprising a substrate with a conductive coating over at least a portion of the substrate comprising a fused nanostructured metal network and a crosslinked polymer binder and having a sheet resistance of no more than about 270 ohms/square, an optical transmittance through the conductive coating of greater than about 90% and a haze of no more than about 1%, wherein the fused nanostructured metal network comprises nanowire segments fused into the network with an average diameter of no more than about 40 nm.

2. The coated substrate of claim 1 wherein the polymer binder comprises a polyurethane, acrylic resin, acrylic copolymer, cellulose or mixture thereof.

3. The coated substrate of claim 1 wherein the nanostructured metal network comprises silver and has a loading on the surface from about 0.5 mg/m$^2$ to about 200 mg/m$^2$.

4. The coated substrate of claim 1 wherein the coating has a sheet resistance of no more than about 150 ohm/sq.

5. The coated substrate of claim 1 wherein the coating has a sheet resistance of no more than about 95 ohm/sq.

6. The coated substrate of claim 1 wherein the coating has an optical transmittance of greater than about 94% and a haze of no more than about 0.9%.

7. A conductive film processing system comprising a metal nanowire ink and a fusing solution, wherein
the metal nanowire ink comprises a first solvent, from about 0.01 weight percent (wt %) to about 2 wt % metal nanowires, from about 0.02 wt % to about 5 wt % crosslinkable organic polymer and from about 0.05 wt % to about 2 wt % processing additive wherein the metal nanowires have an average diameter of no more than about 40 nm, and
the fusing solution comprises a second solvent and a fusing agent selected from the group consisting of a halide anion, or a reducing agent combined with a metal ion source, or a combination thereof.

8. The conductive film processing system of claim 7 wherein the processing additive comprises a wetting agent, a polymer dispersant, a thickener or a mixture thereof.

9. The conductive film processing system of claim 7 wherein the processing additive comprises a thickener.

10. The conductive film processing system of claim 7 wherein the crosslinkable organic polymer comprises a polyurethane, acrylic resin, acrylic copolymer, cellulose or mixture thereof.

11. The conductive film processing system of claim 7 wherein the metal nanowire ink further comprises from about 0.0005 wt % to about 1 wt % crosslinking agent.

12. The conductive film processing system of claim 7 wherein the first solvent is an aqueous solvent.

13. The conductive film processing system of claim 7 wherein the fusing agent comprises a reducing agent.

14. The conductive film processing system of claim 7 wherein the metal nanowire ink comprises from about 0.05 wt % to about 1 wt % metal nanowires, from about 0.05 wt % to about 2 wt % crosslinkable organic polymer and from about 0.1 wt % to about 1.5 wt % processing additive.

15. The conductive film processing system of claim 7 wherein the second solvent comprises alcohol.

16. The conductive film processing system of claim 12 wherein the aqueous solvent comprises an organic solvent.

* * * * *